(12) United States Patent
Suehiro

(10) Patent No.: US 8,523,626 B2
(45) Date of Patent: Sep. 3, 2013

(54) METHOD OF MAKING A LIGHT EMITTING DEVICE

(75) Inventor: Yoshinobu Suehiro, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 557 days.

(21) Appl. No.: 11/898,364

(22) Filed: Sep. 11, 2007

(65) Prior Publication Data
US 2008/0074029 A1   Mar. 27, 2008

(30) Foreign Application Priority Data
Sep. 12, 2006   (JP) .................................. 2006-247285

(51) Int. Cl.
H01J 9/24 (2006.01)
H01J 61/60 (2006.01)

(52) U.S. Cl.
USPC .......................................... 445/23; 313/512

(58) Field of Classification Search
USPC ................................................ 313/487, 503
See application file for complete search history.

(56) References Cited

U.S. PATENT DOCUMENTS

| 2004/0188700 | A1 | 9/2004 | Fukasawa et al. | |
| 2005/0023550 | A1 | 2/2005 | Eliashevich et al. | |
| 2005/0161771 | A1 | 7/2005 | Suehiro et al. | |
| 2005/0211997 | A1* | 9/2005 | Suehiro et al. | 257/88 |
| 2005/0227569 | A1* | 10/2005 | Maeda et al. | 445/25 |
| 2006/0049421 | A1* | 3/2006 | Suehiro et al. | 257/99 |
| 2006/0113906 | A1 | 6/2006 | Ogawa | |
| 2006/0231737 | A1* | 10/2006 | Matsumoto et al. | 250/208.1 |
| 2006/0261364 | A1 | 11/2006 | Suehiro et al. | |
| 2011/0057553 | A1 | 3/2011 | Ogawa | |
| 2011/0101399 | A1 | 5/2011 | Suehiro et al. | |

FOREIGN PATENT DOCUMENTS

| EP | 1603170 A1 * | 12/2005 |
| JP | 10114533 * | 6/1998 |
| JP | 2001-007405(A) | 1/2001 |
| JP | 2002075192 A * | 3/2002 |
| JP | 2003-258308 | 9/2003 |
| JP | 2005-11953 | 1/2005 |
| JP | 2005-051255(A) | 2/2005 |
| JP | 2006-156668(A) | 6/2006 |
| JP | 2006-202726(A) | 8/2006 |
| WO | WO 2004/082036 A1 | 9/2004 |

OTHER PUBLICATIONS

Machine translation of JP 2002-075192, published in Mar. 2002.*
Japanese Office Action dated May 10, 2011 with a partial English translation.
Japanese Office Action dated Sep. 13, 2011 with a partial English translation.

* cited by examiner

Primary Examiner — Anh Mai
Assistant Examiner — Britt D Hanley
(74) Attorney, Agent, or Firm — McGinn IP Law Group, PLLC

(57) ABSTRACT

A light emitting device has a light emitting element, a mounting portion and a sealing part. On the mounting portion, the light emitting element is mounted and a circuit pattern is formed to supply power to the light emitting element. The sealing part is formed on the mounting portion, sealing the light emitting element, and formed of a glass and a phosphor uniformly dispersed in the glass. The phosphor is adapted to emit a wavelength-converted light by being excited by a light emitted from the light emitting element.

20 Claims, 21 Drawing Sheets

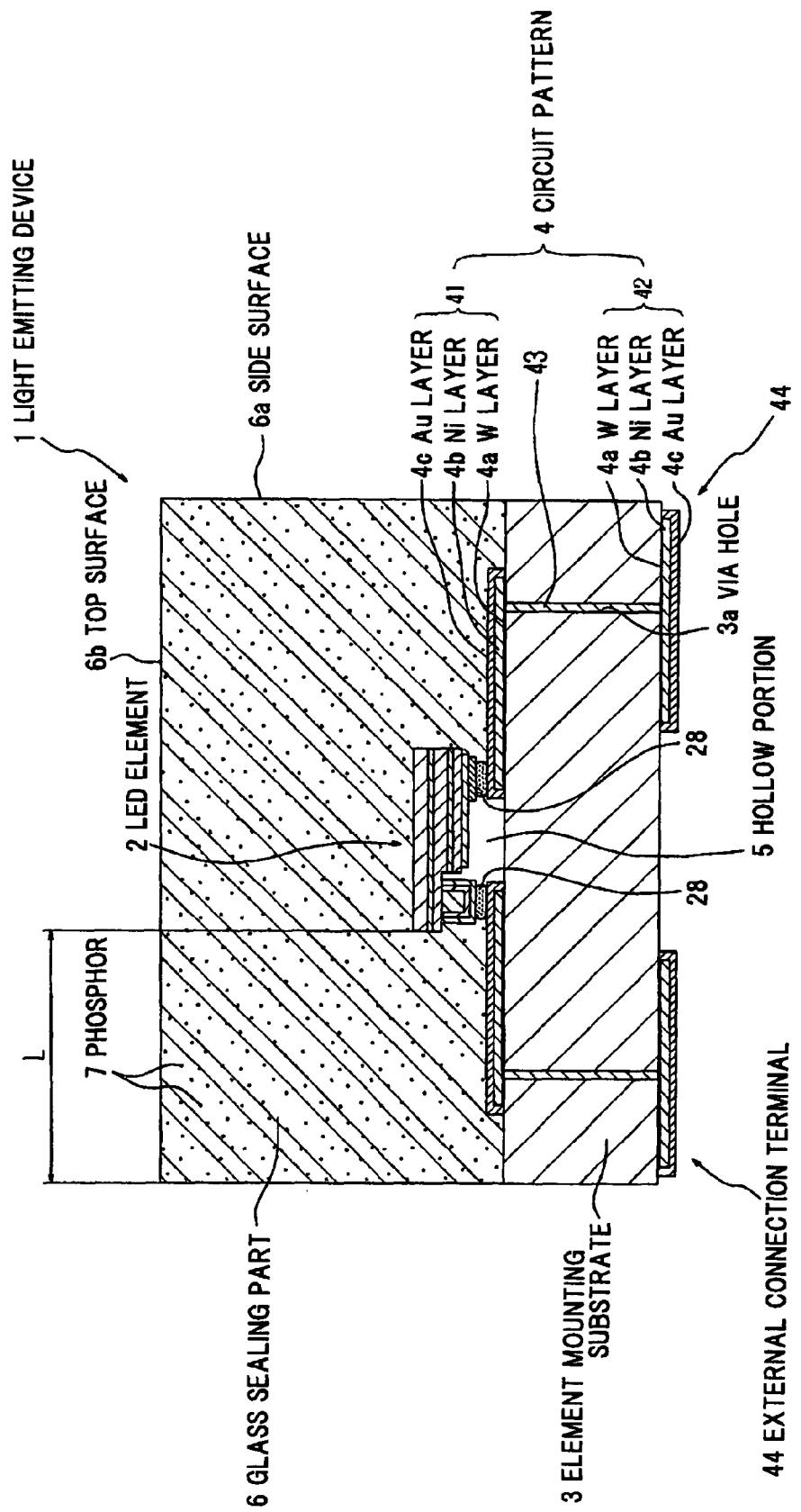

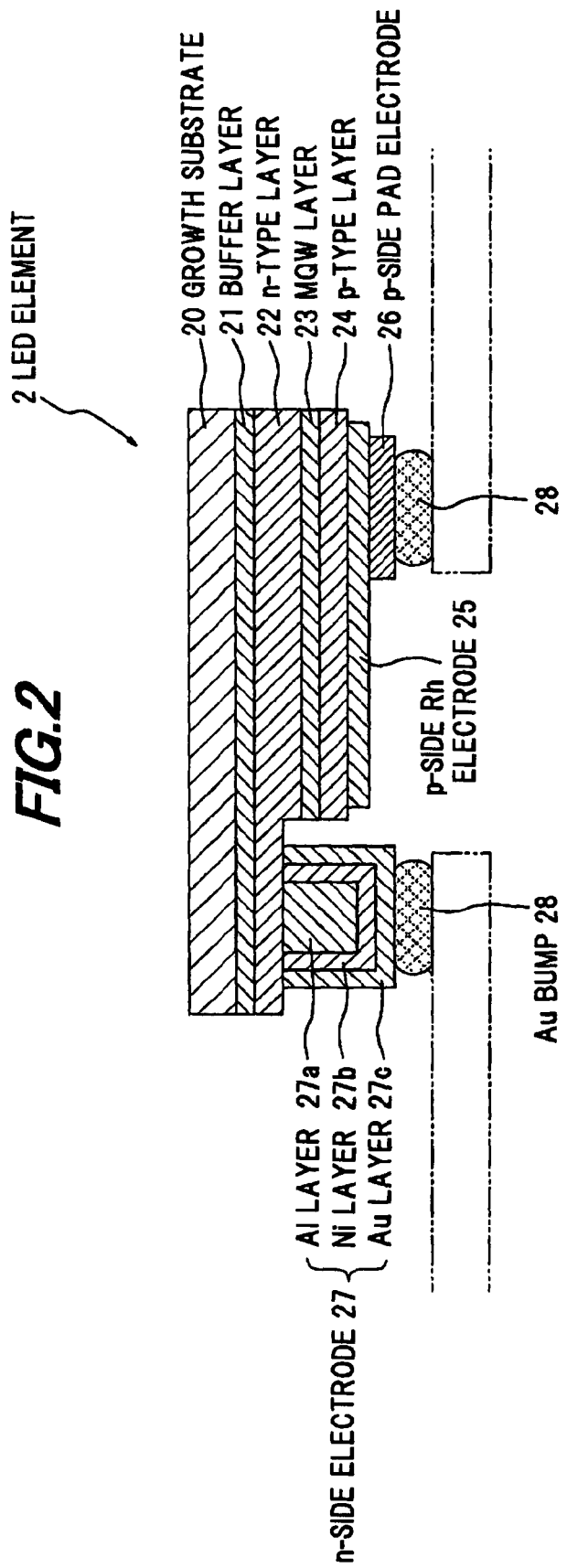

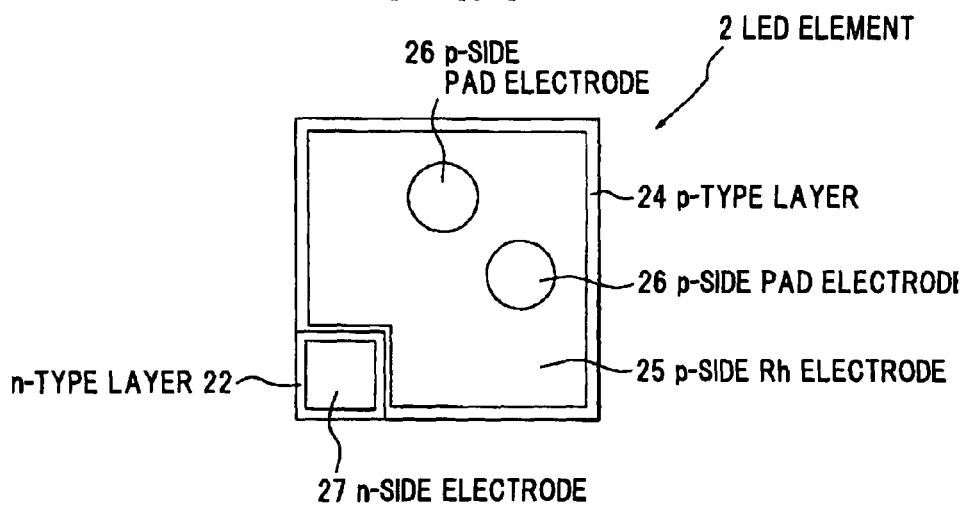
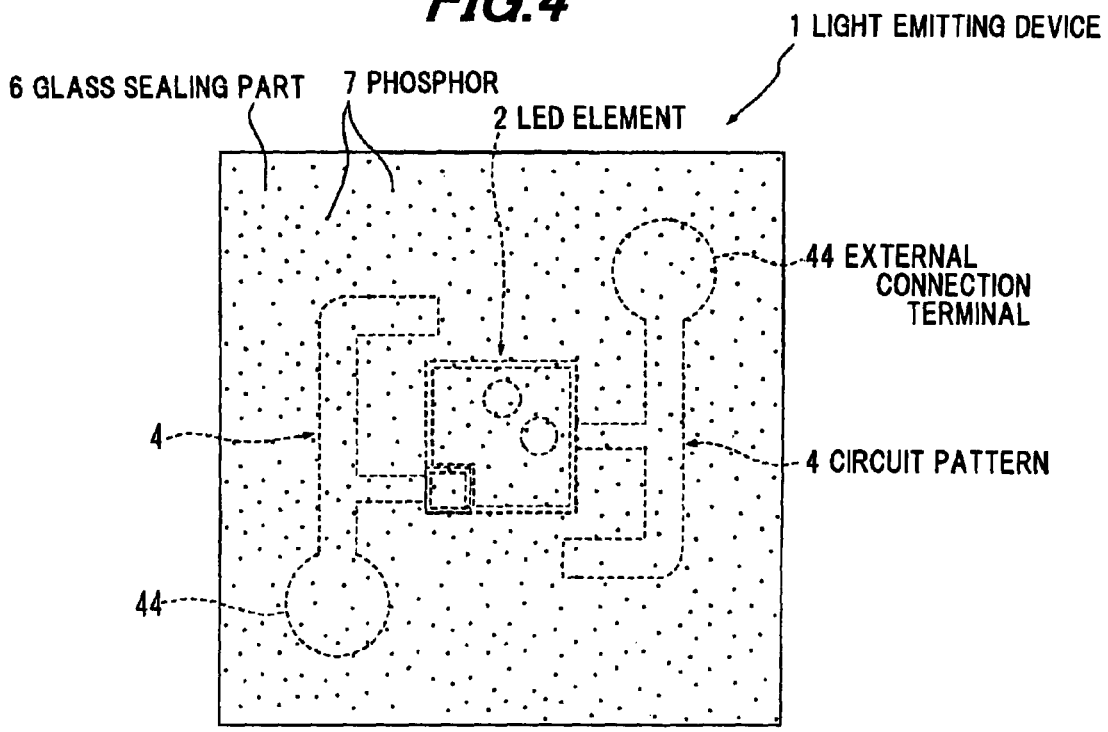

METHOD OF MAKING A LIGHT EMITTING DEVICE

The present application is based on Japanese patent application No. 2006-247285, the entire contents of which are incorporated herein by reference.

BACKGROUND OF THE INVENTION

1. Field of the Invention

This invention relates to a light emitting device that a light emitting element (i.e., an LED element) is mounted on a mounting portion and sealed with glass. Also, this invention relates to a method of making the light emitting device.

2. Description of the Related Art

Conventionally, a light emitting device is known in which a light emitting element such as an LED (=light emitting diode) element is sealed with a transparent resin material such as epoxy and silicone resins. In this kind of light emitting device, a light emitting device is in practical use that an ultraviolet, violet or blue LED chip is used as the light emitting element and a phosphor to be excited by a light emitted from the LED chip is mixed in the transparent resin material to obtain a white light.

However, the light emitting device has a first problem that the transparent resin material deteriorates due to light or heat generated from the LED element. Especially, when the LED element is formed of a group III nitride based compound semiconductor to emit a short-wavelength light, the transparent resin material near the LED element may be yellowed due to high-energy light from the LED element and heat of the LED element itself, so that light extraction efficiency thereof lowers with time.

Furthermore, in the light emitting device, a thermosetting resin is used as the transparent resin material, where thermal hardening is conducted for 30 min to 1 hour in the production process. In this process, the phosphor mixed therein may precipitate in the resin material since it has a specific gravity three to four times that of the thermosetting resin and the viscosity of the resin lowers by heat. Thus, a second problem arises that the phosphor cannot be dispersed uniformly in the resin so that unevenness in white light discharged externally may be caused.

JP-A-2005-011953 discloses a light emitting device using glass as a sealing material to prevent the deterioration of the sealing material. The light emitting device of JP-A-2005-011953 is produced such that two glass sheets are prepared, a phosphor layer is sandwiched between the glass sheets, and the laminate of the glass sheets and the phosphor layer is fusion-bonded to an $Al_2O_3$ substrate on which an LED element is mounted.

On the other hand, JP-A-2003-258308 discloses an emission color conversion member that an inorganic phosphor is dispersed in glass. The emission color conversion member of JP-A-2003-258308 is produced such that a preliminary molded material is produced by mixing a glass powder and an inorganic phosphor powder while adding a resin binder, and the preliminary molded material is baked to have the sintered conversion member while removing the resin binder. JP-A-2003-258308 further discloses that the emission color conversion member is formed disk-shaped or cylindrical with a cap and is supported by a support member.

However, the light emitting device of JP-A-2005-011953 may cause a problem that a light emitted laterally from the LED element may be discharged externally without passing through the phosphor layer to allow unevenness in emission color thereof depending on the dimensions of components of the device.

The light emitting device of JP-A-2003-258308 may cause a problem that a light generated within the LED element formed of a high-refractive index material may not be externally discharged unless the LED element is sealed with a transparent resin or glass, to reduce the light extraction efficiency. Further, it may cause a problem that unevenness in emission color may arise necessarily by an optical path difference of light emitted from the LED element since the conversion member is located spaced from the LED element in any case where the disk-shaped conversion member is disposed in a case opening on the bottom of which the LED element is mounted or where the LED element is surrounded by the conversion member formed cylindrical with the cap.

SUMMARY OF THE INVENTION

It is an object of the invention to provide a light emitting device that allows the enhancement of the light extraction efficiency and the reduction of color unevenness of light discharged externally while preventing the deterioration of the sealing material formed on the LED element.

(1) According to one embodiment of the invention, a light emitting device comprises:

a light emitting element;

a mounting portion on which the light emitting element is mounted and a circuit pattern is formed to supply power to the light emitting element; and a sealing part formed on the mounting portion, sealing the light emitting element, and comprising a glass and a phosphor uniformly dispersed in the glass, the phosphor being adapted to emit a wavelength-converted light by being excited by a light emitted from the light emitting element.

By the above embodiment (1), the light emitting element is sealed by the glass with the phosphor uniformly dispersed therein. Therefore, light emitted from the light emitting element can be uniformly wavelength-converted regardless of its radiation angle and discharged out of the sealing part. Further, the glass sealing part for sealing the light emitting element can be prevented from the deterioration.

(2) According to another embodiment of the invention, a light emitting device comprises:

a light emitting element;

a mounting portion on which the light emitting element is mounted, a circuit pattern is formed to supply power to the light emitting element, and a phosphor layer is formed, the phosphor layer comprising a first phosphor adapted to emit a first wavelength-converted light by being excited by a light emitted from the light emitting element; and a sealing part formed on the mounting portion, sealing the light emitting element, and comprising a glass and a second phosphor uniformly dispersed in the glass, the second phosphor being adapted to emit a second wavelength-converted light by being excited by the light emitted from the light emitting element.

By the above embodiment (2), the light emitting element is sealed by the glass with the phosphor uniformly dispersed therein. Therefore, light emitted from the light emitting element can be uniformly wavelength-converted regardless of its radiation angle and discharged out of the sealing part. Also, incident light to the phosphor layer from the light emitting element can be uniformly wavelength-converted. Further, the glass sealing part for sealing the light emitting element can be prevented from the deterioration.

In the above embodiments (1) and/or (2), the following modifications, changes and a combination thereof can be made.

(i) The circuit pattern and the phosphor layer are surrounded by a junction of the sealing part and the mounting portion.

By this construction, the sealing part and the mounting portion are bonded each other at a place where the circuit pattern and the phosphor layer is not formed, so that the bonding strength between sealing part and the mounting portion can be secured.

(ii) The first phosphor comprises the same composition as the second phosphor, and the first wavelength-converted light comprises the same emission color as the second wavelength-converted light.

(iii) The phosphor layer is operable to wavelength-convert a light traveling from the light emitting element toward the mounting portion to increase a reflectivity of the circuit pattern to the light.

(iv) The mounting portion comprises a roughened surface, and the sealing part is bonded to the mounting portion at a junction and comprises a surface roughened along the roughened surface at the junction.

By this construction, since the sealing part is formed along the roughened surface of the mounting portion, no gap is left between the sealing part and the mounting portion so that bonding strength between sealing part and the mounting portion can be secured.

(v) The mounting portion comprises a transparent material,
the circuit pattern is formed near the light emitting element, and
the phosphor layer is formed on the circuit pattern.

By this construction, light emitted from the light emitting element to the circuit pattern enters into the circuit pattern after being wavelength-converted by the phosphor layer. Therefore, light emitted from the light emitting element can be converted into a wavelength to yield a high reflectivity in the circuit pattern, so that the reduction of light extraction efficiency can be suppressed that may be caused by light passing through the transparent mounting portion.

(vi) The mounting portion comprises a transparent polycrystalline alumina.

(vii) The circuit pattern comprises a top layer comprising Ag.

(viii) The light emitting element comprises an emission wavelength less than 550 nm,
the circuit pattern comprises a top layer comprising Au, and
the phosphor (layer) emits a light with a wavelength not less than 550 nm by being excited by the light emitted from the light emitting element.

(ix) The light emitting element emits a blue light, and the phosphor emits a yellow light by being excited by the blue light.

(x) The light emitting element emits an ultraviolet light, and the phosphor (layer) comprises a blue phosphor to emit a blue light by being excited by the ultraviolet light, a green phosphor to emit a green light by being excited by the ultraviolet light, and a red phosphor to emit a red light by being excited by the ultraviolet light.

(xi) The sealing part comprises a ZnO—$SiO_2$—$R_2O$ based glass, where R comprises at least one of group I elements.

(3) According to another embodiment of the invention, a method of making a light emitting device, where a light emitting element is mounted on a mounting portion, comprises:

a mixing step for mixing a powder glass and a powder phosphor to produce a mixed powder that the powder phosphor is dispersed in the powder glass;

a glass production step for melting the mixed powder to produce a melt and then solidifying the melt to produce a phosphor dispersed glass; and a glass sealing step for bonding the phosphor dispersed glass to the mounting portion with the light emitting element mounted thereon to seal the light emitting element.

The light emitting device produced by the above embodiment (3) can be constructed such that the light emitting element is sealed by the glass with the phosphor uniformly dispersed therein. Therefore, light emitted from the light emitting element can be uniformly wavelength-converted regardless of its radiation angle and discharged out of the sealing part. Also, incident light to the phosphor layer from the light emitting element can be uniformly wavelength-converted. Further, the glass sealing part for sealing the light emitting element can be prevented from the deterioration.

In the above embodiment (3), the following modifications, changes and a combination thereof can be made.

(xii) The method further comprises:
a plate formation step for forming the phosphor dispersed glass produced by the glass production step into a plate glass,
wherein the glass sealing step is conducted such that the plate glass formed by the plate formation step is bonded to the substantially flat mounting portion.

(4) According to another embodiment of the invention, a method of making a light emitting device, where a light emitting element is mounted on a mounting portion, comprises:

a mixing step for mixing a powder glass and a powder phosphor to produce a mixed powder that the powder phosphor is dispersed in the powder glass; and a glass sealing step for melting the mixed powder to produce a melt in a decompression high-temperature atmosphere and then solidifying the melt to produce a phosphor dispersed glass on the mounting portion and to bond the phosphor dispersed glass to the mounting portion with the light emitting element mounted thereon to seal the light emitting element.

The light emitting device produced by the above embodiment (4) can be constructed such that the light emitting element is sealed by the glass with the phosphor uniformly dispersed therein. Therefore, light emitted from the light emitting element can be uniformly wavelength-converted regardless of its radiation angle and discharged out of the sealing part. Also, incident light to the phosphor layer from the light emitting element can be uniformly wavelength-converted. Further, the glass sealing part for sealing the light emitting element can be prevented from the deterioration.

BRIEF DESCRIPTION OF THE DRAWINGS

The preferred embodiments according to the invention will be explained below referring to the drawings, wherein:

FIG. 1 is a schematic cross sectional view showing a light emitting device in a first preferred embodiment according to the invention;

FIG. 2 is a schematic cross sectional view showing an LED element in FIG. 1;

FIG. 3 is a schematic top view showing an electrode formation surface of the LED element in FIG. 1;

FIG. 4 is a top view showing a circuit pattern formed on an element mounting substrate in FIG. 1;

DETAILED DESCRIPTION OF THE PREFERRED EMBODIMENTS

First Embodiment

Figure 5:
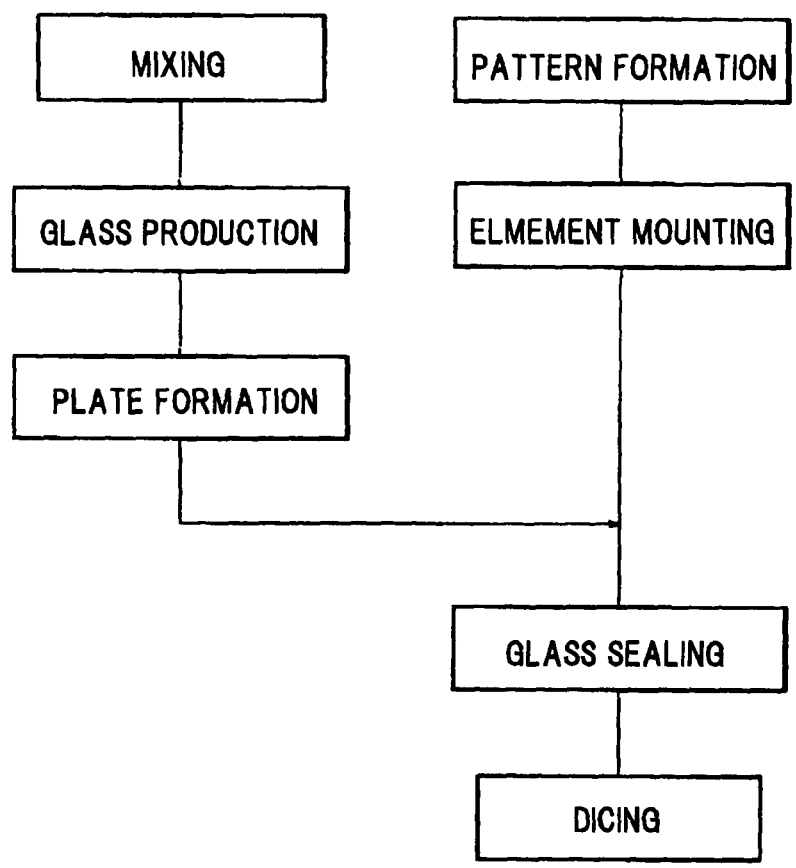
FIG. 5 is a diagram showing a process of making the light emitting device in FIG. 1.

FIGS. 1 to 7 show the first preferred embodiment of the invention, where FIG. 1 is a schematic cross sectional view showing a light emitting device in the first preferred embodiment according to the invention, and FIG. 2 is a schematic cross sectional view showing an LED element in FIG. 1.

As shown in FIG. 1, the light emitting device 1 is composed of the flip-chip type LED element 2 formed of a GaN based semiconductor material, an element mounting substrate 3 to mount the LED element 2 thereon, a circuit pattern 4 formed on the element mounting substrate 3 and formed of tungsten (W)-nickel (Ni)-gold (Au), and a glass sealing part 6 to seal the LED element 2, being bonded to the element mounting substrate 3 and containing a phosphor 7 therein. A hollow portion 5 into which the sealing glass is not penetrated is formed between the LED element 2 and the element mounting substrate 3. In this embodiment, the element mounting substrate 3 and the circuit pattern 4 compose "a mounting portion" to mount the LED element 2 and to supply power to the LED element 2.

As shown in FIG. 2, the LED element 2 as a light emitting element is composed such that a group III nitride based semiconductor is epitaxially grown on the a growth substrate 20 of sapphire ($Al_2O_3$) to form a buffer layer 21, an n-type layer 22, an MQW layer 23 and a p-type layer 24 in this order. The LED element 2 is epitaxially grown at a temperature of 700° C. or more, and has an upper temperature limit of 600° C. or more, whereby it is stable even at a processing temperature in a sealing process as described later using a low-melting heat melting glass. The LED element 2 is further composed of a p-side Rh electrode 25 formed on the surface of the p-type layer 24, a p-side pad electrode 26 formed on the p-side Rh electrode 25, and an n-side electrode 27 formed on a part of the n-type layer 22 exposed by partially etching the p-side layer 24 through the n-type layer 22. Au bumps 28 are formed on the p-side pad electrode 26 and the n-side electrode 27, respectively.

The p-side Rh electrode 25 is formed of rhodium (Rh) and functions as a light reflection layer to reflect light emitted from the MQW layer 23 as a light emitting layer in the direction of the growth substrate 20.

FIG. 3 is a schematic top view showing an electrode formation surface of the LED element 2. As shown, in this embodiment, the two p-side pad electrodes 26 are formed on the p-side Rh electrode 25 and the Au bumps 28 are formed on the p-side pad electrodes 26, respectively.

The n-side electrode 27 is provided with a contact layer and a pad layer each formed in the same area. As shown in FIG. 2, the n-side electrode 27 is composed of an Al layer 27a, a Ni thin layer 27b covering the Al layer 27a and an Au layer 27c covering the surface of the Ni layer 27b. In this embodiment, as shown in FIG. 3, the n-side electrode 27 is formed on the corner of the electrode formation surface of the LED element 2, and the p-side Rh electrode 25 is formed on substantially the entire electrode formation surface except the formation area of the n-side electrode 27 (when viewed from the top).

The LED element 2 is 100 μm in thickness and formed 300 μm square, and has a thermal expansion coefficient of $7 \times 10^{-6}$/° C. In detail, the GaN layer of the LED element 2 has a thermal expansion coefficient of $5 \times 10^{-6}$/° C. but the growth substrate 20 occupying the most part of the LED element 2 has a thermal expansion coefficient of $7 \times 10^{-6}$/° C. Therefore, the entire LED element 2 has substantially the same thermal expansion coefficient as the growth substrate 20. Meanwhile, the drawings of this application are drawn in dimensions different from real dimensions in order to make clear the composition of each part of the LED element 2.

The element mounting substrate 3 is formed of polycrystalline alumina ($Al_2O_3$) sintered material. It is 0.25 mm in thickness and formed 1.0 mm square, and has a thermal expansion coefficient of $7 \times 10^{-6}$/° C.

As shown in FIG. 1, the circuit pattern 4 of the element mounting substrate 3 is composed of a surface pattern 41 formed on the surface of the substrate 3 to be electrically connected to the LED element 2, and a back surface pattern 42 formed on the back surface of the substrate 3 to be electrically connected to an external terminal.

The surface pattern 41 is composed of a W layer 4a patterned according to the form of the electrodes of the LED element 2, a Ni thin layer 4b covering the surface of the W layer 4a, and an Au thin layer 4c covering the surface of the Ni layer 4b. The back surface pattern 42 is composed of a W layer 4a patterned according to the form of an external connection terminal 44 as described later, a Ni thin layer 4b covering the surface of the W layer 4a, and an Au thin layer 4c covering the surface of the Ni layer 4b. The surface pattern 41 is electrically connected to the back surface pattern 42 through a via pattern 43 formed of W and formed in a via hole 3a passing through the element mounting substrate 3 in the thickness direction thereof.

FIG. 4 is a top view showing the circuit pattern 4 formed on the element mounting substrate 3. As shown, the external connection terminals 44 are formed on the anode side and the cathode side, respectively. The external connection terminals 44 are, in the plain view, disposed diagonally on the element mounting substrate 3.

The glass sealing part 6 is formed of a $ZnO$—$B_2O_3$—$SiO_2$—$Nb_2O_5$—$Na_2O$—$Li_2O$ based heat melting glass in which the phosphor 7 is dispersed uniformly. The glass composition is not limited to this. For example, the heat melting glass does not always include $Li_2O$ and may include an optional component such as $ZrO_2$ and $TiO_2$.

As shown in FIG. 1, the glass sealing part 6 is formed rectangular solid on the element mounting substrate 3 and has a thickness of 0.5 mm. A side surface 6a of the glass sealing part 6 is formed by cutting by a dicer the element mounting substrate 3 with the plate glass bonded to the element mounting substrate 3 by the hot pressing. A top surface 6b of the glass sealing part 6 composes a surface of the plate glass bonded to the element mounting substrate 3 by the hot pressing.

The heat melting glass has a glass transition temperature (Tg) of 490° C. and a deformation point (At) of 520° C., where the glass transition temperature (Tg) is sufficiently low as compared to the formation temperature of the epitaxial growth layer of the LED element 2. In this embodiment, the glass transition temperature (Tg) is 200° C. or more lower than the formation temperature of the epitaxial growth layer. The heat melting glass has a thermal expansion coefficient ($\alpha$) of $6 \times 10^{-6}$/° C. in the range of 100 to 300° C. The thermal expansion coefficient ($\alpha$) becomes larger than this as the processing temperature is beyond the glass transition temperature (Tg). Thus, the heat melting glass is bonded to the element mounting substrate 3 at about 600° C. so as to allow the hot pressing. The heat melting glass of the glass sealing part 6 has a refractive index of 1.7.

The composition of the heat melting glass may be arbitrary if the glass transition temperature (Tg) thereof is lower than the upper temperature limit of the LED element 2 and the thermal expansion coefficient ($\alpha$) thereof is substantially equivalent to that of the element mounting substrate 3. For example, glasses with a relatively low glass transition temperature (Tg) and a relatively small thermal expansion coefficient ($\alpha$) include a $ZnO$—$SiO_2$—$R_2$ based glass (where R is at least one selected from group I elements such as Li, Na and K), a phosphate based glass and a lead glass. Of these, the $ZnO$—$SiO_2$—$R_2O$ based glass is most suitable since it is better in humidity resistance than the phosphate based glass and does not cause environmental issues unlike the lead glass.

The heat melting glass is defined as a glass material produced through a melt state or softened state thereof by heat melting, and is different from a glass produced by a sol-gel method. The sol-gel glass widely changes in volume in the production process and tends to generate cracks so that it is difficult to form a thick glass film. In contrast, the heat melting glass can eliminate the problem described above. Further, the sol-gel glass tends to generate fine pores therein so that airtightness thereof may be reduced. In contrast, the heat melting glass does not cause the problem so that the LED element 2 can be sealed securely.

Generally, the heat melting glass is processed at a extremely high viscosity beyond a level regarded as a high viscosity in resins. In case of glasses, even if temperature thereof exceeds the deformation point (At) by several tens of degrees (° C.), viscosity thereof does not lower to the level of general sealing resins. If viscosity thereof intentionally lowers to the level of general sealing resins, the sealing and molding become difficult since temperature thereof may exceed the crystal growth temperature of the LED element 2, or flowing of softened glass may occur although the glass may not be adhered to the mold. Therefore, it is preferred that the hot pressing is conducted at a viscosity of $10^4$ poise or more.

The phosphor 7 is a yellow phosphor to emit a yellow light with a peak wavelength in yellow wavelength region by being excited blue light emitted from the MQW layer 23. In this embodiment, the phosphor 7 is made of a YAG (yttrium aluminum garnet) phosphor and has an average particle diameter of 10 μm in the glass sealing part 6. Alternatively, the phosphor 7 may be a silicate phosphor or a mixture of YAG and silicate phosphors at a given ratio.

A method of making the light emitting device 1 will be explained below with reference to FIG. 5, a process flow diagram thereof.

First, the $ZnO$—$B_2O_3$—$SiO_2$—$Nb_2O_5$—$Na_2O$—$Li_2O$ based heat melting glass is crushed to produce a glass powder with an average particle diameter of 30 μm. This is mixed with the YAG phosphor 7 with an average particle diameter of 10 μm to produce a mixed powder 10 where the phosphor 7 is uniformly dispersed in the glass powder (Mixing Step).

Figure 6A:
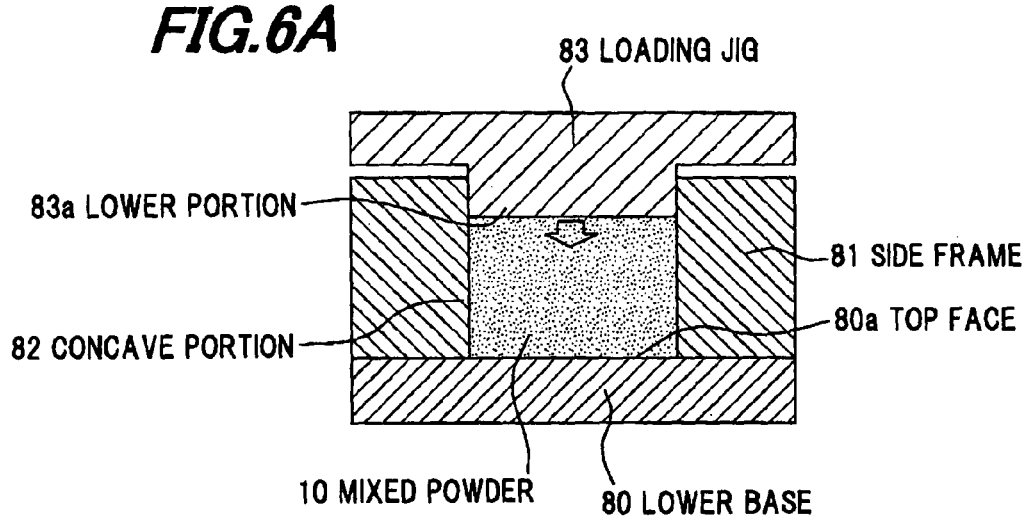
FIG. 6A is a cross sectional view showing an apparatus for producing a phosphor dispersed glass from a mixed powder.
Figure 6B:
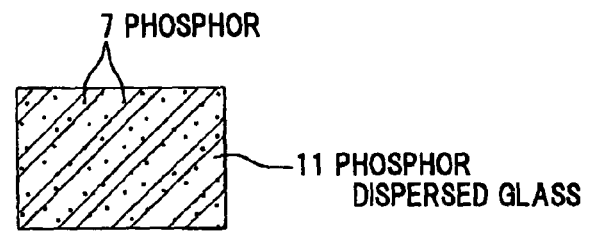
FIG. 6B is a cross sectional view showing the phosphor dispersed glass produced from the mixed powder.
Figure 6C:
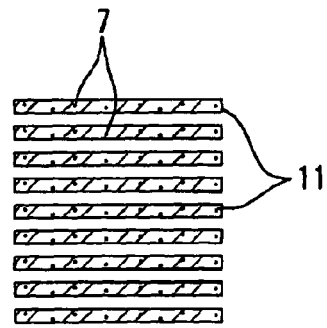
FIG. 6C is a cross sectional view showing a state where the phosphor dispersed glass obtained as above is sliced into plates.

FIG. 6A is a cross sectional view showing an apparatus for producing a phosphor dispersed glass from the mixed powder. FIG. 6B is a cross sectional view showing the phosphor dispersed glass produced from the mixed powder. FIG. 6C is a cross sectional view showing a state where the phosphor dispersed glass obtained as above is sliced into plates.

The mixed powder 10 produced in the mixing step is melted by applying a load thereto. Then, the mixed powder 10 is solidified to produce the phosphor dispersed glass 11 (Glass Producing Step). In detail, as shown in FIG. 6A, a concave portion 82 opened upward is formed such that a cylindrical side frame 81 is disposed on a top face 80a of a lower base 80 to surround a given region over the lower base 80. The concave portion 82 has the same diameter all in the vertical direction and a loading jig 83 has a lower portion 83a which is formed to match the section form of the concave portion 82 and is movable vertically in the concave portion 82.

The mixed powder 10 is loaded in the concave portion 82 and the loading jig 83 for applying a load within the concave portion 82 is set thereon. Then, the ambient air is decompressed to 7.6 Torr and heated to 650° C., and the mixed powder 10 is compressed and melted at a pressure of 20 kg/cm² by using the loading jig 83. Then, by cooling the melted mixed powder 10 to solidify it, the phosphor dispersed glass 11 as shown in FIG. 6B can be obtained in which the phosphor 7 is uniformly dispersed therein without producing a remaining air bubble with a size to cause an optical influence or white turbidity. The remaining air bubble with a size to cause the optical influence is, e.g., a bubble with a diameter of 100 μm or more with respect to the LED element 2 formed 300 μm square. If such a bubble exists near the LED element 2, light emitted from the LED element 2 may be re-entered into the LED element 2 to reduce the light extraction efficiency.

Then, as shown in FIG. 6C, the phosphor dispersed glass 11 thus produced is sliced into plates with a thickness according to that of the glass sealing part 6 (Slicing Step). In this embodiment, the glass sealing part 6 has a thickness of 0.5 mm.

In this embodiment, no binder is used in producing the phosphor dispersed glass 11. Thereby, no air bubbles is generated in the phosphor dispersed glass 11 so that light entering the glass is not scattered by the air bubbles therein unlike the case where the mixed powder is based using the resin binder. Further, the airtightness is not impaired by the air bubbles when the LED element 2 is sealed by the glass.

In the phosphor dispersed glass 11 thus produced, the phosphor 7 can be dispersed substantially uniformly since it is dispersed before the glass is melted. For example, with regard to numerical data, in an arbitrary volume of $\{10\times(\text{phosphor average width})/(\text{phosphor containing volume ratio})^{1/3}\}^3$, the phosphor containing volume ratio is in the range of desirably 50 to 200%, more desirably 80 to 125% relative to the overall mean. In the phosphor dispersed glass 11 obtained exactly, the phosphor 7 containing volume ratio is in the range of 80 to 125% in 9 regions divided into three equal parts in arbitrary three directions orthogonal to each other, so as to ensure that the phosphor 7 is uniformly dispersed. In addition, the phosphor 7 containing volume ratio in each region is further desirably in the range of 90 to 112%. If necessary, the fracturing degree of the glass may be increased to have the same particle size as the phosphor 7, where the uniform dispersion can be obtained in a more micro region.

On the other hand, independent of the phosphor dispersed glass 11, the element mounting substrate 3 with the via hole 3a formed therein is provided. W paste is screen printed on the surface of the element mounting substrate 3 according to the circuit pattern 4. Then, the element mounting substrate 3 with the W paste printed thereon is heated at 1000° C. or more to burn the W into the surface of the element mounting substrate 3. Then, Ni and Au are plated on the W to form the circuit pattern 4 (Pattern Formation Step). Meanwhile, the surface of the polycrystalline alumina can be roughened such that, instead of the flattening step by polishing for fining the circuit pattern 4, the micro-uneven surface can be provided by the grain boundary of the polycrystalline alumina, or the uneven surface can be formed by blast finishing.

Then, the plural LED elements 2 are electrically bonded through the Au bumps 28 onto the surface pattern 41 of the circuit pattern 4 of the element mounting substrate 3 (Element Mounting Step). In this embodiment, the three bump bonds in total are made, two points for the p-side and one point for the n-side.

Figure 7:
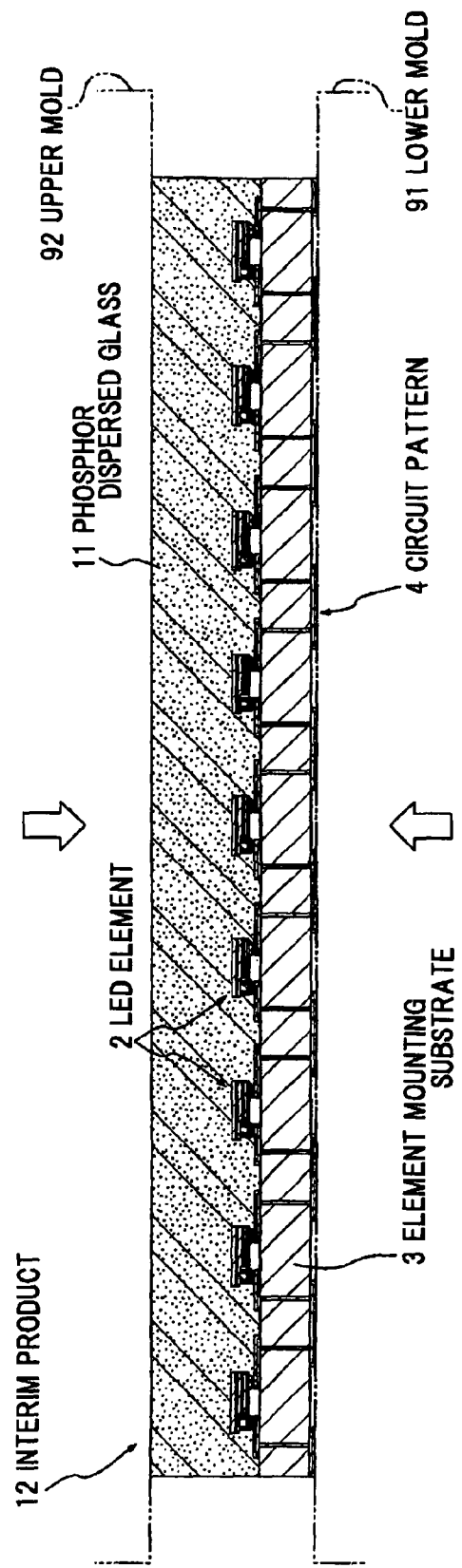
FIG. 7 is a schematic cross sectional view showing a state where the plate phosphor dispersed glass is hot-pressed onto the element mounting substrate with the LED element mounted thereon.

Then, the element mounting substrate 3 with the LED elements 2 mounted thereon is placed on a lower mold 91, and the plate phosphor dispersed glass 11 is placed on an upper mold 92. The lower mold 91 and the upper mold 92 are each provided with a heater so as to independently control the temperature of the molds 91 and 92. Then, as shown in FIG. 7, the hot pressing is conducted in nitrogen atmosphere by placing the phosphor dispersed glass 11 on the substantially planar mounting surface of the element mounting substrate 3 and then applying a pressure to the lower mold 91 and the upper mold 92. Thereby, the phosphor dispersed glass 11 is adhered to the element mounting substrate 3 with the LED elements 2 mounted thereon, so that the LED elements 2 are each sealed with the phosphor dispersed glass 11 on the element mounting substrate 3 (Glass Sealing Step). FIG. 7 schematically shows the state where the plate phosphor dispersed glass is hot-pressed onto the element mounting substrate 3 with the LED elements 2 mounted thereon. In this embodiment, the pressing is conducted at about 20 to 40 kgkf/cm². The hot pressing may be in an atmosphere inert to the respective components, e.g., in vacuum instead of the nitrogen atmosphere.

Thus, the phosphor dispersed glass 11 is bonded to the element mounting substrate 3 through oxides included therein. It is preferred that the heat melting glass is in the viscosity range of $10^5$ to $10^7$ poise during the hot pressing. In this viscosity range, problems due to low viscosity can be prevented that the glass is adhered to the upper mold 92 or flown outside without avail, and problems due to high viscosity can be prevented that the bonding strength of the glass to the element mounting substrate 3 lowers or the crushing degree of the Au bumps 28 increases.

As described earlier, the polycrystalline alumina surface of the element mounting substrate 3 is roughened so that the bonding interface of the glass sealing part 6 is roughened along the roughened surface of the element mounting substrate 3. This is achieved, e.g., by an additional pressurization during the hot pressing as well as a decompressed atmosphere pressure lower than the atmospheric pressure. If the conditions are satisfied to allow the glass to enter sufficiently in the concave portion of the roughened polycrystalline alumina, the pressurization conditions or the atmosphere decompression conditions during the hot pressing can be arbitrarily taken. For example, the processing can be completed by conducting either of the pressurization and the atmosphere decompression during the hot pressing. As a result, no gap can be left between the glass sealing part 6 and the element mounting substrate 3 so as to secure the bonding strength therebetween.

In order to shorten the cycle time of the hot pressing, a preheating stage may be taken before the pressing to previously heat the glass sealing part 6 and an annealing stage may be taken after the pressing to control the cooling speed of the glass sealing part 6. Further, the hot pressing can be conducted on the preheating stage and the annealing stage. Thus, the steps in the hot pressing can be suitably changed.

By the above steps, an interim product 12 as shown in FIG. 7 can be produced that the plural LED elements 2 are connected in the lateral direction. Then, the element mounting substrate 3 integrated with the glass sealing part 6 is placed on a dicer and diced to be separated into each LED element 2, whereby the light emitting device 1 is completed (Dicing Step). By cutting simultaneously the glass sealing part 6 and the element mounting substrate 3 by the dicer, the element mounting substrate 3 and the glass sealing part 6 can have side faces aligned each other.

The light emitting device 1 thus composed operates such that the LED element 2 emits blue light when a voltage is applied to the LED element 2 through the circuit pattern 4. A part of the blue light emitted from the LED element 2 is converted into yellow light by the phosphor 7 in the glass sealing part 6, and the remainder is discharged out of the glass sealing part 6 without being wavelength-converted. Thus, light discharged from the glass sealing part 6 has peak wavelengths in yellow and blue regions, so that white light is radiated out of the device.

Since the phosphor 7 is dispersed uniformly in the glass sealing part 6, light from the LED element 2 can be uniformly wavelength-converted regardless of the radiation angle, so that there occurs no unevenness in emission color of the light discharged outside.

Since the occurrence of the air bubble in the glass sealing part 6 can be prevented, light is not scattered and reflected within the glass sealing part 6 so that the expected light extraction efficiency can be secured. Further, the airtightness of the LED element 2 is not impaired by the air bubble.

It is desired that the particle size of the glass in the mixed powder 10 is in the range of several micrometers to 200 μm so as to prevent the impurity contamination or physical damage during the crushing, to prevent the occurrence of remaining bubbles during the glass melting, and to allow the uniform dispersion of the phosphor 7 in the glass. As a result, the case that there is no phosphor 7 in a continuous region with a diameter of 300 μm or more can be avoided.

As described earlier, when the glass particle has the same particle size as the phosphor 7, unevenness in emission color can be prevented even in a thin package where the distance L (See FIG. 1) between the LED element 2 and the glass sealing part 6 is 0.25 mm. By the inventor's experiments, even a thin package being 0.1 mm in L can be realized, and this package can be also adapted for the above effect.

In this embodiment, since the mixed powder 10 is melted while applying a load, the powder can be melted at temperature lower than that in case of applying no load. Further, since it can be processed near the deformation point (At), the crystallization can be stably prevented even when using an unstable ZnO based glass. Meanwhile, the phosphor 7 can be uniformly dispersed even when melting the glass without applying the load and the glass melting may be conducted while applying a pressure of 50 kgf/cm$^2$ by using a pressing machine. The degree of the decompressed atmosphere and pressurization can be suitably determined according to the property of the glass. It is not always necessary to use both the decompressed atmosphere and the glass pressurization. It is beyond question that the glass can be melted by using either of the decompressed atmosphere and the glass pressurization.

Since the glass sealing part 6 is formed of the $ZnO-B_2O_3-SiO_2-Nb_2O_5-Na_2O-Li_2O$ based heat melting glass, the glass sealing part 6 can have good stability and weather resistance. Therefore, even when the light emitting device 1 is used under a severe environment for long hours, the deterioration of the glass sealing part 6 can be suppressed to effectively prevent the reduction of the light extraction efficiency with time. In addition, the glass sealing part 6 has a high refractive index and high transmissivity so that the light emitting device 1 can have high emission efficiency as well as the high reliability.

Since the glass sealing part 6 is formed of the glass with a deformation point (At) lower than the epitaxial growth temperature of the semiconductor layer of the LED element 2, the LED element 2 is not thermally impaired by heating during the hot pressing, and the glass can be processed at temperature sufficiently lower than that of the crystal growth temperature of the semiconductor layer. Further, since the plate heat melting glass is set parallel to the element mounting substrate 3 and hot-pressed thereto at high viscosity, the heat melting glass moves in parallel to plane-contact the surface of the element mounting substrate 3 to seal the GaN based LED element 2 so that no void is produced therebetween.

Since the element mounting substrate 3 is bonded to the glass sealing part 6 based on the chemical bonding through the oxides, the sealing strength can be enhanced. Therefore, even a small package with a small bonding area can be realized.

Since the glass sealing part 6 has substantially the same thermal expansion coefficient as the element mounting substrate 3, a bonding failure such as peeling and cracking is less likely to occur even when brought to room temperature or low temperature after bonding at high temperature.

In addition, since glass materials hardly generate cracks by compression stress although easily generate cracks by tensile stress, the glass sealing part 6 is set to have a thermal expansion coefficient a bit lower than the element mounting substrate 3.

In general, the glass material has a property that the thermal expansion coefficient thereof increases at a higher temperature than the Tg (glass transition) point. Thus, when the glass sealing is conducted at a higher temperature than the Tg point, it is preferable to consider the thermal expansion coefficient not only at temperature lower than the Tg point but also at temperature higher than the Tg point in order to achieve the stable glass sealing. In other words, the glass material constituting the glass sealing part 6 needs to have a thermal expansion coefficient similar to that of the element mounting substrate 3 in consideration of the thermal expansion coefficient including that at higher temperature than the Tg point as described above. Thereby, internal stress to cause a warpage in the element mounting substrate 3 can be reduced, and shear failure can be prevented from occurring in the glass even when the bonding between the element mounting substrate 3 and the glass sealing part 6 can be secured.

Thus, by expanding the size of the element mounting substrate 3 and the glass sealing part 6, the quantity of devices to be produced together can be increased. The inventor confirm that no peeling or cracking does not occur even in 1000 cycles of liquid-phase thermal shock test (−40° C. to 100° C.). Further, when a bonding base test for glass materials with a size of 5 mm×5 mm to ceramic substrates is conducted, where the glass materials and the ceramic substrates with various thermal expansion coefficients are combined, it is confirmed that the bonding can be achieved without causing cracks if one material with lower thermal expansion coefficient has a ratio in thermal expansion coefficient of 0.85 or more to the other material with higher thermal expansion coefficient. Herein, "substantially the same thermal expansion coefficient(s)" means the above ratio range, although it depends on stiffness, size etc. of the materials.

Since the LED element 2 is flip-chip mounted and no wires are needed, no failure in electrodes occurs even when conducting the sealing process at a high viscosity. That is, the viscosity of the heat melting glass during the sealing process is as high as $10^4$ to $10^8$ poise and the properties thereof are extremely different than the epoxy resins which are in liquid form and has only a viscosity of about 5 poise before the thermal hardening. Therefore, if a face-up type LED element is used where an electrode on the surface of the element is connected to a power supplying member such as a lead by wire, crash or deformation of the wire may occur during the glass sealing process, but this can be prevented by using the flip-chip mounting. Further, if a flip-chip type LED element is used where an electrode on the surface of the element is flip-chip mounted on a power supplying member such as a lead through an Au bump etc., crash of the bump or short circuit between the bumps may occur due to pressure applied in the direction of the power supplying member to the LED element 2 based on the high viscosity of the glass, but this can be also prevented.

The surface pattern 41 on the element mounting substrate 3 is drawn to the back surface pattern 42 through the via pattern 43. Therefore, the production process can be simplified without requiring special countermeasures against the problems that the glass material penetrates into unnecessary sites and that the electrical terminal is covered with the glass material. Further, since the plural LED elements 2 are simultaneously sealed by the plate phosphor dispersed glass 11, the plural light emitting devices 1 can be easily mass-produced by dicing. Meanwhile, since the heat melting glass is processed at high viscosity, the mass-production can be sufficiently achieved if only the external terminals are drawn to the back surface even without using the via holes, where the countermeasures required for the resin sealing are not necessary.

The LED elements 2 are flip-chip mounted, so that the ultra-small light emitting device 1 such as 0.5 mm square can be realized as well as solving the problems in conducting the glass sealing process. This is because the boding space for wires is not needed and no peeling at the interface occurs even at a small bonding space since the glass sealing part 6 and the element mounting substrate 3 have substantially the same thermal expansion coefficients and are securely bonded based on the chemical bonding.

The LED element 2 and the glass sealing part 6 have substantially the same thermal expansion coefficients. Thus, since all the adjacent members including the element mounting substrate 3 have substantially the same thermal expansion coefficients, the internal stress caused can be very low even in the temperature difference between high temperature during the glass sealing process and room temperature, so that stable workability can be obtained without generating cracks. Further, the internal stress can be thus reduced to enhance the impact resistance, so that the glass sealing type LED with high reliability can be obtained.

The element mounting substrate 3 is used as an alumina substrate, so that the parts cost can be reduced, and the reduction in device cost can be realized as well as the mass productivity since it is readily available. Further, $Al_2O_3$ has a good thermal conductivity, so that it can be sufficiently adapted to high brightness or high output type devices. Furthermore, since the element mounting substrate 3 has a small light absorption, it is optically advantageous.

Although in the first embodiment, the LED element 2 is composed such that the GaN based semiconductor material is formed on the growth substrate of sapphire, the GaN based semiconductor material may be formed on the growth substrate of GaN or SiC. In this case, the LED element 2 with the growth substrate with a higher refractive index than 1.7 (=sapphire's refractive index) is combined with the glass sealing part 6 with a higher refractive index than 1.6, so that the light extraction efficiency from the LED element 2 to outside can be enhanced. Further, since the growth substrate is made of the conductive material, current introduced into the light emitting layer can be uniformed to enhance the internal emission efficiency of LED element 2.

Although in the first embodiment, the light emitting device 1 uses the LED element 2 made of a GaN based semiconductor material, the LED element is not limited to the GaN based LED element 2, and may be made of another semiconductor material such as ZnSe based and SiC based semiconductor materials.

The LED element 2 may be produced by scribing. In this case, the LED element 2 produced by scribing may have on a side surface thereof, as a cut section, a sharpened concave and convexity, and the side surface of the LED element 2 is preferably coated by an element coating material. The element coating material includes $SiO_2$ based coating material with optical transparency. The element coating material can prevent the occurrence of cracks and voids in case of overmolding etc.

The glass sealing part 6 may deteriorate when dew condensation generates depending on the use conditions of the device although it is excellent in weather resistance as described earlier. Even in this case, although the device is desirably composed so as not to have the dew condensation, the glass sealing portion 6 can be prevented from deteriorating due to the dew condensation at high temperature by coating a silicone resin etc. on the surface of the glass sealing portion 6. The coating material coated on the surface of the glass sealing portion 6 preferably includes an inorganic material such as a $SiO_2$ based material and $Al_2O_3$ based material which has not only humidity resistance but also acid resistance and alkali resistance.

Second Embodiment

Figure 8:
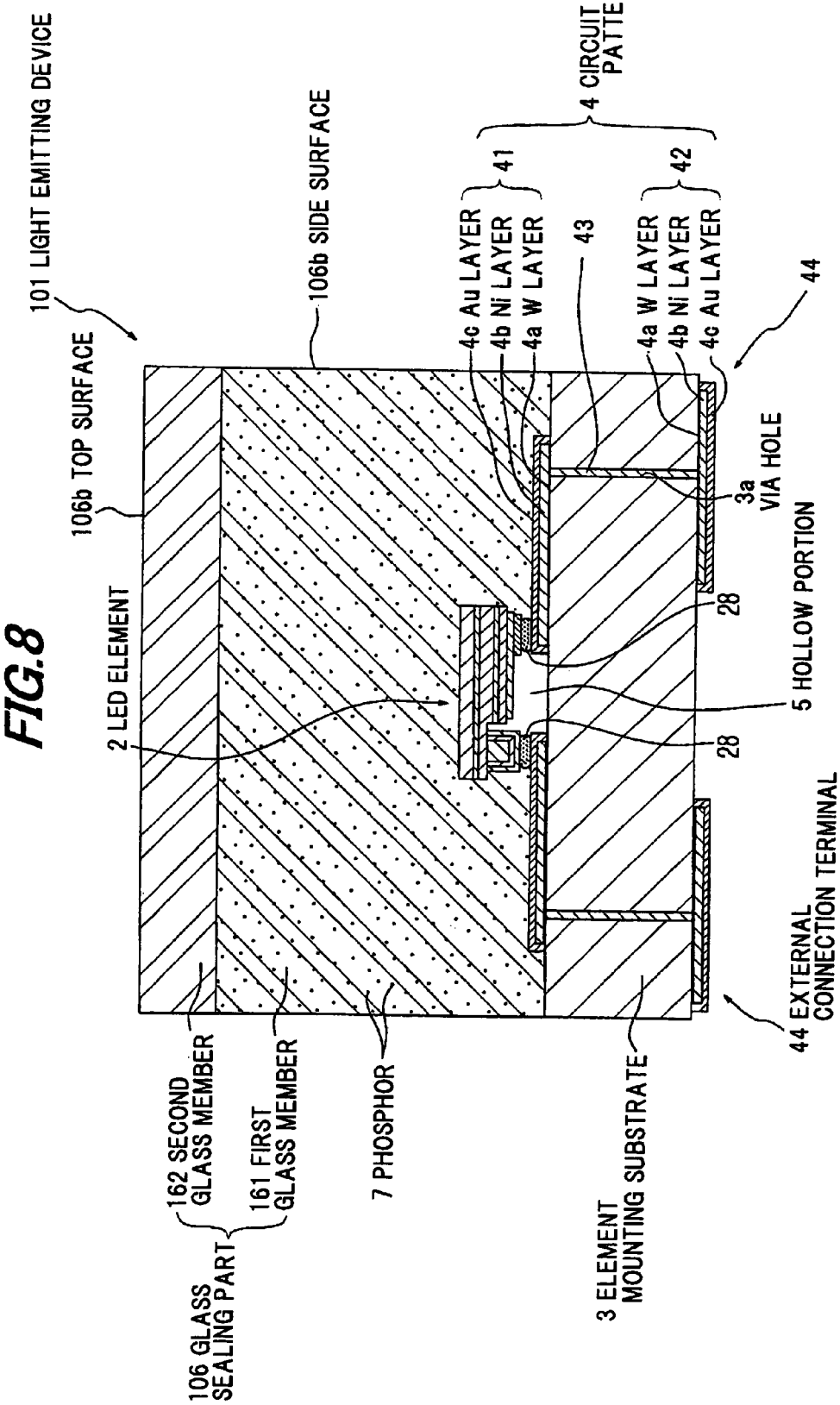
FIG. 8 is a schematic cross sectional view showing a light emitting device in a second preferred embodiment according to the invention.
Figure 9:
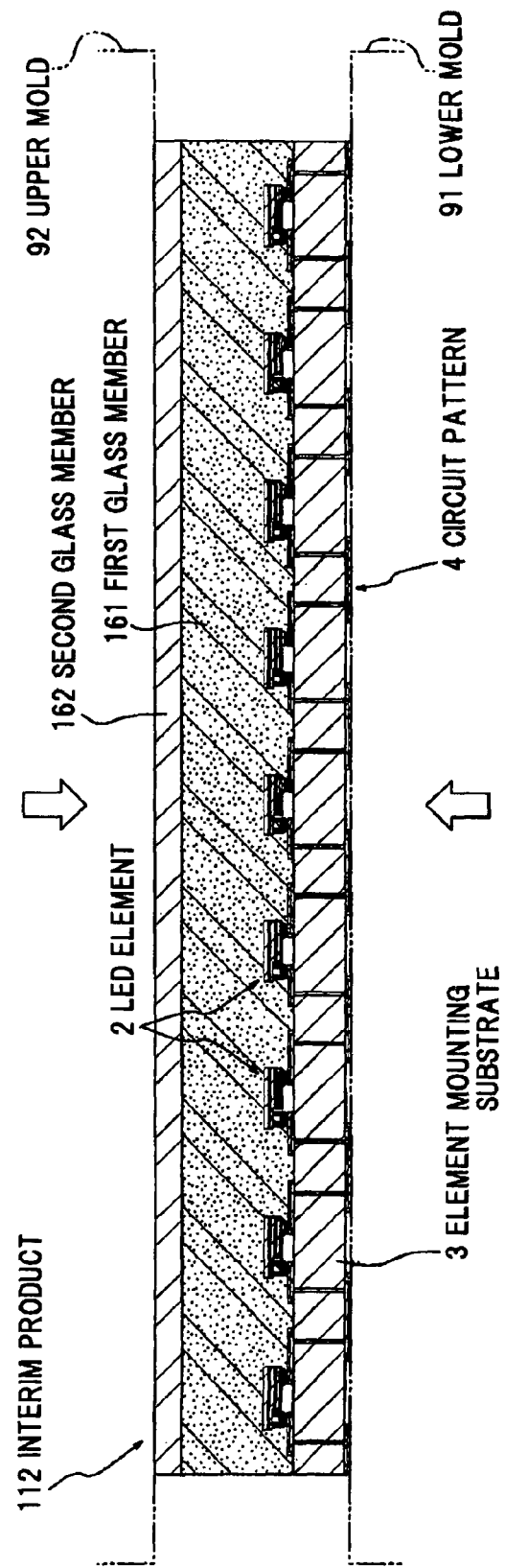
FIG. 9 is a schematic cross sectional view showing a state where the light emitting device of the second embodiment is produced by hot pressing.

FIGS. 8 and 9 show a light emitting device 101 in the second preferred embodiment according to the invention. FIG. 8 is a schematic cross sectional view showing the light emitting device 101 of the second embodiment. Hereinafter, like components are indicated by the same numerals as used in the first embodiment, and duplicate explanation thereof is omitted below. Unlike the first embodiment, the second embodiment is composed such that a glass sealing part 106 is composed of two layers.

As shown in FIG. 8, the light emitting device 101 is composed of the flip-chip type LED element 2 of GaN based semiconductor material, the element mounting substrate 3 to mount the LED element 2 thereon, the circuit pattern 4 formed on the element mounting substrate 3 and formed of tungsten (W)—nickel (Ni)—gold (Au), and the glass sealing part 106 to seal the LED element 2, being bonded to the element mounting substrate 3 and containing a phosphor 7 therein. The light emitting device 101 of the second embodiment has the same composition as the light emitting device 1 of the first embodiment except the glass sealing part 106.

The glass sealing part 106 is composed of a first glass member 161 and a second glass member 162 formed on the element mounting substrate 3, where the phosphor 7 is included in the first glass member 161. The element mounting substrate 3, the first glass member 161 and the second glass member 162 have side faces aligned one another. Thus, the light emitting device 101 is formed rectangular solid on the whole, and has a top surface 106b formed parallel to the element mounting substrate 3 and a side surface 106a formed perpendicular to the top surface 106b by being cut by the dicer. The interface of the first glass member 161 and the second glass member 162 is formed linear in the cross section.

The first glass member 161 is formed of a $ZnO—B_2O_3—SiO_2—Nb_2O_5—Na_2O—Li_2O$ based heat melting glass, formed rectangular solid on the element mounting substrate 3, and formed 0.5 mm in thickness. Like the heat melting glass of the first embodiment, the heat melting glass composing the first glass member 161 has a glass transition temperature (Tg) of 490° C., a deformation point (At) of 520° C., a thermal expansion coefficient ($\alpha$) of $6 \times 10^{-6}$/° C in the range of 100 to 300° C., and a refractive index (n) of 1.7.

The second glass member 162 is formed of $SiO—B_2O_3$ based heat melting glass, and formed rectangular solid on the first glass member 161. The second glass member 162 has a higher glass transition temperature (Tg) than the first glass member 161, whereby its mold releasing property can be enhanced. For example, the second glass member 162 has a glass transition temperature (Tg) of 560° C. Further, the second glass member 162 has thermal properties such as glass transition temperature (Tg) higher than the first glass member 161, and is more excellent in humidity resistance, acid resistance and alkali resistance than the first glass member 161. The second glass member 162 may be made of $SiO—B_2O_3$ based $SiO—B_2O_3—Al_2O_3$ based, $SiO—Al_2O_3$ based, $SiO—R_2$ based (where R is Li, Na, K etc.), and a glass material with the other composition. In general, in many cases, a glass material with high thermal properties is excellent in humidity resistance, acid resistance and alkali resistance.

The second glass member 162 has a thickness of 0.15 mm, and a thermal expansion coefficient ($\alpha$) of $7\times10^{-6}/°$ C. This thermal expansion coefficient ($\alpha$) is a value in the range of 100 to 300° C. and becomes a larger value above the glass transition temperature (Tg). The second glass member 162 has a refractive index of 1.5. The second glass member 162 has the top surface 106b formed parallel to the mounting surface of the element mounting substrate 3.

In the light emitting device 101 thus composed, the first glass member 161 is bonded to the element mounting substrate 3, while the second glass member 162 is not in contact with the element mounting substrate 3. In making the light emitting device 101, the phosphor dispersed glass 11 (=the first glass member 161) as used in the first embodiment is stacked on the second glass member 162 to produce a glass laminate. In the hot pressing process, as shown in FIG. 9, the element mounting substrate 3 with the LED elements 2 mounted thereon is placed on the lower mold 91, and the plate glass laminate composed of the first glass member 161 (=the phosphor dispersed glass 11) and the second glass member 162 is placed on the upper mold 92. Thus, the second glass member 162 located opposite the element mounting substrate 3 is in contact with the upper mold 92, and the first glass member 161 is not in contact with the upper mold 92. FIG. 9 schematically shows the state where the light emitting device 101 of the second embodiment is produced by hot pressing.

Thus, an interim product 112 is produced by the hot pressing. Then, the lower mold 91 and the upper mold 92 are released from the element mounting substrate 3 and the second glass member 162, respectively. In this step, since the second glass member 162 has a higher glass transition temperature (Tg) than the first glass member 161, the second glass member 162 has a higher mold-releasing property from the upper mold 92 than the first glass member 161 so that the plate glass laminate can be smoothly released from the upper mold 92. The hot pressing of this embodiment is conducted at about 600° C. like the first embodiment. In this step, the second glass member 162 is not sufficiently softened since it has a glass transition temperature (Tg) of 560° C., so that the second glass member 162 can be prevented from being persistently adhered to the upper mold 92.

Thus, for the light emitting device 101 of the second embodiment, processing requirements in the hot pressing are conditions such as temperature and pressure in case of bonding the first glass member 161 to the element mounting substrate 3, and conditions such as temperature and pressure in case of releasing the second glass member 162 from the upper mold 92. In consideration of this, the first glass member 161 is formed of the material suited to bond the first glass member 161 to the element mounting substrate 3 in the hot pressing, and the second glass member 162 is formed of the material suited to release the second glass member 162 from the upper mold 92 in/after the hot pressing. In the second embodiment, since the second glass member 162 has a higher glass transition temperature (Tg), i.e., higher mold-releasing property than the first glass member 161, the processing conditions can be relaxed as compared to the case that the first glass member 161 is released from the upper mold 92. As a result, the processing conditions such as temperature and pressure can be widened that are imposed on the first and second glass members 161, 162 during the hot pressing.

For example, in researching the processing temperature condition, although the allowable temperature range in the hot pressing is only 10 to 30° C. in case of composing the glass sealing part 106 by only the first glass member 161, when the glass sealing part 106 is composed by the first glass member 161 and the second glass member 162 as in this embodiment, it is confirmed that the allowable temperature range in the hot pressing is widened to at least 50° C. or more.

As described above, in this embodiment, adding to the effects of the first embodiment, the formation process of the glass sealing part 106 can be facilitated. Further, since the unnecessary adherence of the glass sealing part 106 to the upper mold 92 can be prevented as well as the bonding failure of the glass sealing part 106 to the element mounting substrate 3, the reduction of production yield can be prevented effectively.

Furthermore, the second glass member 162 with more excellent humidity resistance, acid resistance and alkali resistance than the first glass member 161 is disposed on the top portion of the glass sealing part 106 where the amount of external radiation light from the LED element 2 is relatively large. Therefore, the deterioration of the top portion of the glass sealing part 106 can be effectively prevented. Thus, the deterioration of light extraction efficiency with time of the light emitting device 101 can be prevented.

Third Embodiment

Figure 10:
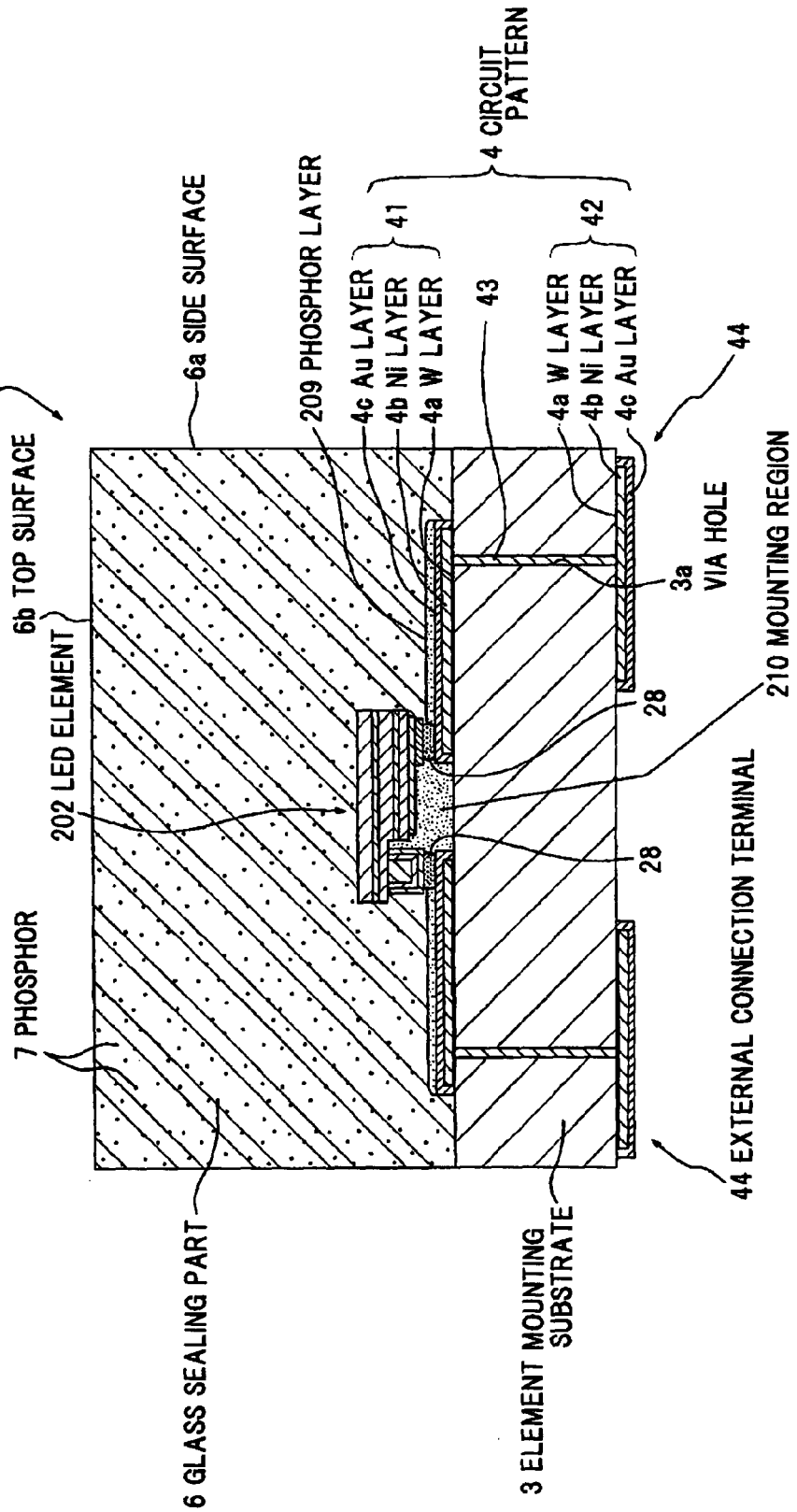
FIG. 10 is a schematic cross sectional view showing a light emitting device in a third preferred embodiment according to the invention.
Figure 11:
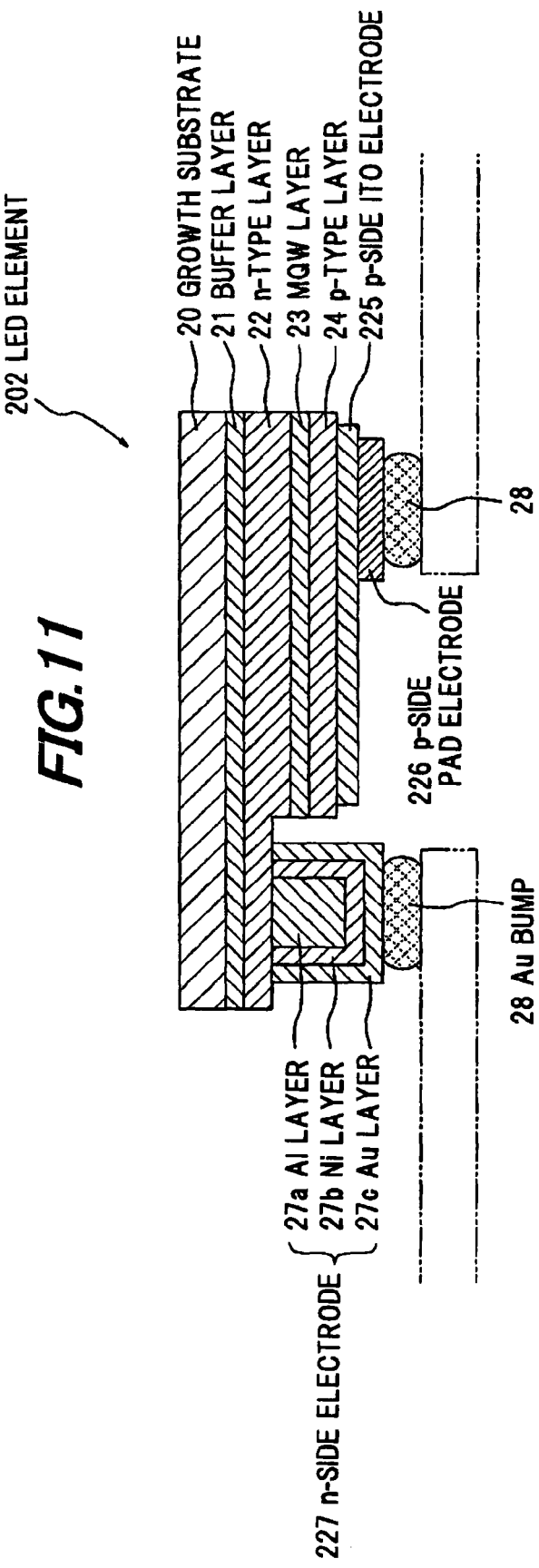
FIG. 11 is a schematic cross sectional view showing an LED element in FIG. 10.

FIGS. 10 to 13 show a light emitting device 201 in the third preferred embodiment according to the invention. FIG. 10 is a schematic cross sectional view showing the light emitting device 201, and FIG. 11 is a schematic cross sectional view showing an LED element 202 in FIG. 10. Hereinafter, like components are indicated by the same numerals as used in the preceding embodiments, and duplicate explanation thereof is omitted below. Unlike the first embodiment, the third embodiment is composed such that a phosphor layer is provided on the circuit pattern 4 etc. of the element mounting substrate 3, and that the LED element 202 is modified from the LED element 2.

As shown in FIG. 10, the light emitting device 201 is composed of the flip-chip type LED element 202 formed of a GaN based semiconductor material, an element mounting substrate 3 to mount the LED element 202 thereon, a circuit pattern 4 formed on the element mounting substrate 3 and formed of tungsten (W)-nickel (Ni)-gold (Au), a glass sealing part 6 to seal the LED element 202, being bonded to the element mounting substrate 3 and containing a phosphor 7 therein, and a phosphor layer 209 covering a predetermined region on the element mounting substrate 3.

The light emitting device 201 of the third embodiment has the same composition as the light emitting device 1 of the first embodiment, except the composition of the light emitting device 202, that the circuit pattern 4 is disposed overall near a mounting region of the LED element 202 on the element mounting substrate 3, and that the phosphor layer 209 is disposed near the mounting region of the LED element 202. "near" as described above means such a range that a major part of light to be emitted from the LED element 202 and irradiated to the element mounting substrate 3 reaches. As shown in FIG. 10, the circuit pattern 4 and the phosphor layer 209 are disposed in a width about three times the width of the LED element 202. However, these may be disposed in a width equal to that of the LED element 202.

As shown in FIG. 11, the LED element 202 is composed such that a group III nitride based semiconductor is epitaxially grown on the a growth substrate 20 of sapphire ($Al_2O_3$) to form a buffer layer 21, an n-type layer 22, an MQW layer 23 and a p-type layer 24 in this order. The LED element 202 is epitaxially grown at a temperature of 700° C. or more, and has an upper temperature limit of 600° C. or more, whereby it is stable even at the processing temperature in the sealing process as described earlier using the low-melting heat melting glass. The LED element 202 is further composed of a p-side ITO (indium tin oxide) electrode 225 formed on the surface of the p-type layer 24, a p-side pad electrode 226 formed on the p-side ITO electrode 225, and an n-side electrode 227 formed on a part of the n-type layer 22 exposed by partially etching the p-side layer 24 through the n-type layer 22. Au bumps 28 are formed on the p-side pad electrode 226 and the n-side electrode 227, respectively.

The p-side ITO electrode 225 is a transparent electrode, where a part of light emitted from the MQW layer 23 enters into the p-side ITO electrode 225. A part of light entering into the p-side ITO electrode 225 is reflected on the interface of the p-side ITO electrode 225 and the hollow portion 5, and the remainder enters into the side of the element mounting substrate 3. Light entering into the side of the element mounting substrate 3 is wavelength-converted by the phosphor layer 209 and is then reflected on the Au layer 4c of the surface pattern 41.

Figure 12:
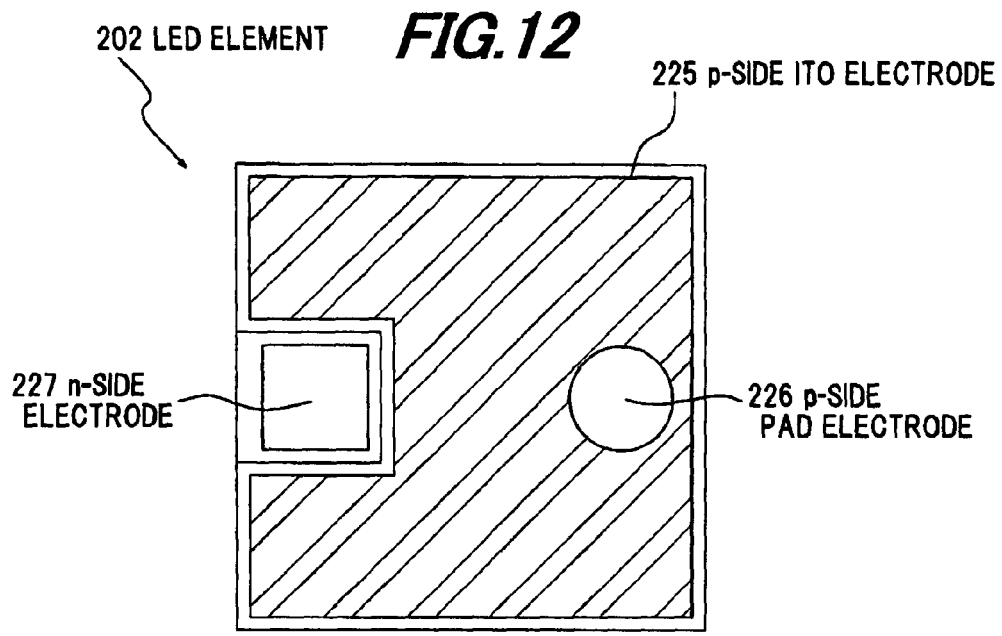
FIG. 12 is a schematic top view showing an electrode formation surface of the LED element in FIG. 10.

FIG. 12 is a schematic top view showing an electrode formation surface of the LED element 202. As shown, in this embodiment, the one p-side pad electrode 226 is formed on the p-side ITO electrode 225 and the Au bump 28 is formed on the p-side pad electrode 226.

The n-side electrode 227 is provided with a contact layer and a pad layer each formed in the same area. As shown in FIG. 11, the n-side electrode 227 is composed of an Al layer 27a, a Ni thin layer 27b covering the Al layer 27a and an Au layer 27c covering the surface of the Ni layer 27b. In this embodiment, as shown in FIG. 12, the n-side electrode 227 is formed near on one side of the electrode formation surface of the LED element 202, and the p-side ITO electrode 225 is, in the plain view, formed substantially on the entire surface except the formation area of the n-side electrode 227.

The phosphor layer 209 is formed of a ZnO based glass, and includes a yellow phosphor to emit a yellow light with a peak wavelength in yellow wavelength region by being excited blue light emitted from the MQW layer 23. The phosphor layer 209 is disposed between the MQW layer 23 and the surface pattern 41, in this embodiment, formed on the surface pattern 41. The phosphor layer 209 and the surface pattern 41 are surrounded by the bonding portion of the glass sealing part 6 and the element mounting substrate 3 (when viewed from the top). The glass sealing part 6 and the element mounting substrate 3 are bonded each other at a part where the circuit pattern 4 and the phosphor layer 209 are not formed. Therefore, they can prevent causing the peeling by sufficient bonding strength therebetween, or the penetration of water into the LED element 202. Thus, the bonding strength between the glass sealing part 6 and the element mounting substrate 3 can be secured.

Figure 13:
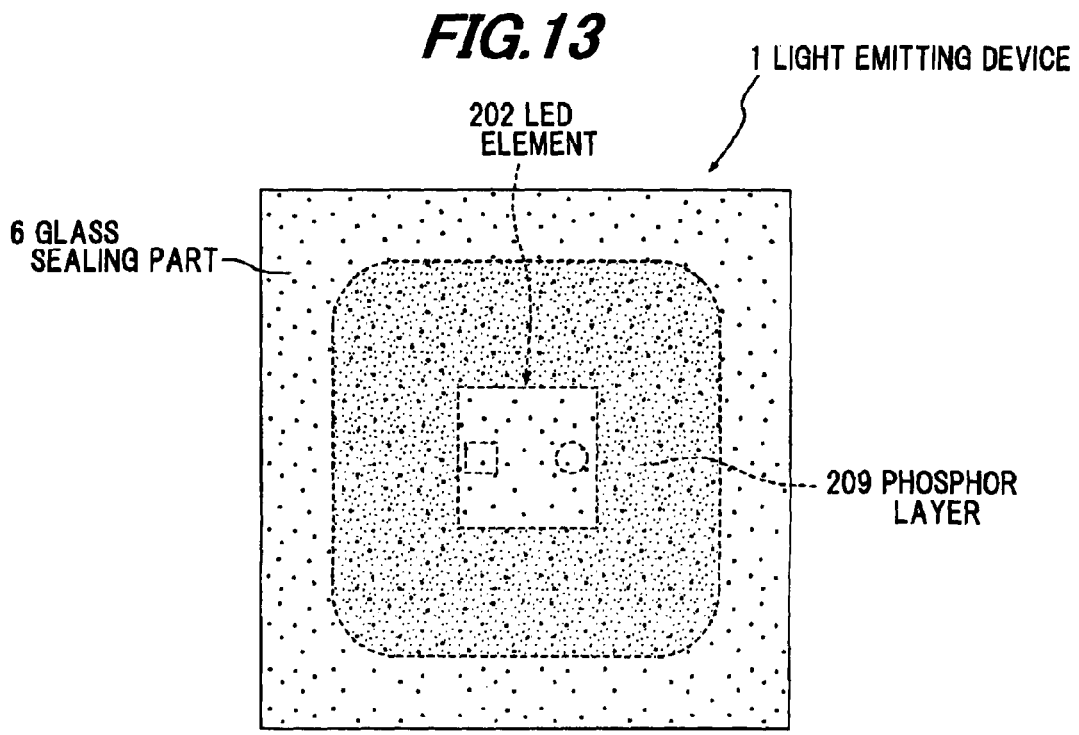
FIG. 13 is a top view showing a circuit pattern formed on the element mounting substrate in FIG. 10.

The phosphor layer 209 is coated before the LED element 202 is mounted on the element mounting substrate 3, and is further coated on a part other than the region where the surface pattern 41 is formed on the element mounting substrate 3. A mounting region 210 (See FIG. 10, i.e., a region corresponding to the hollow portion 5 of the light emitting device 1 in the first embodiment) of the LED element 202 may be filled by the same phosphor as the phosphor layer 209 after the formation of the Au bumps 28. The phosphor included in the phosphor layer 209 can be a YAG phosphor, a silicate phosphor or a mixture of the YAG and silicate phosphors at a given ratio. In this embodiment, as shown in FIG. 13, the phosphor layer 209 is formed nearly square at the center of the element mounting substrate 3 (when viewed from the top). For example, the phosphor layer 209 is formed 0.6 mm square on the element mounting substrate 3 formed 1.0 mm square (when viewed from the top).

The phosphor layer 209 of the light emitting device 201 is thus formed on the element mounting substrate 3, so that blue light emitted from the LED element 202 to the side of the element mounting substrate 3 can enter into the surface pattern 41 while being wavelength-converted into a yellow light. The surface pattern 41 has the Au layer 4c on the top, where the long wavelength-converted incident light can be reflected nearly 100% on the surface although a short wavelength light such as blue light can be reflected only about 40% thereon.

The element mounting substrate 3 of alumina ($Al_2O_3$) polycrystal has transparency, where incident light into the element mounting substrate 3 can pass through downward in FIG. 10 or absorbed by the W layer 4a of the back surface pattern 42. However, the incident light into the element mounting substrate 3 can be prevented by the Au layer 4c of the surface pattern 41 formed overall in the region where the LED element 202 is mounted.

Most of light emitted from the bottom of the LED element 202 to the side of the element mounting substrate 3 and then reflected on the phosphor layer 209 (i.e., the interface between the phosphor layer 209 and the element mounting substrate 3) again passes through the LED element 202 and is externally radiated therefrom. Here, the absorptance in the LED element 202 to yellow light is lower than that to blue light. Therefore, optical loss can be reduced by converting blue light into yellow light by the phosphor (i.e., phosphor layer 209) placed between the LED element 202 and the element mounting substrate 3.

Further, in this embodiment, the glass sealing part 6 can have a given color by reducing the concentration of the phosphor 7 included therein due to using the phosphor layer 209, so that optical loss due to light confinement of the phosphor 7 can be reduced. Thus, the light extraction efficiency of the light emitting device 201 can be enhanced.

As embodied in this embodiment, even when the p-side contact electrode is formed with the transparent electrode (ITO), light passing therethrough can be sufficiently reflected on the surface pattern 41. Thus, the freedom in choice of the p-side contact electrode can be enhanced.

In the conventional resin sealing method, bump bonding is frequently conducted at three points or more to overcome the peeling stress in the LED element caused by the resin with large thermal expansion coefficient due to heat in the sealing process. However, in this embodiment, since the element mounting substrate 3, the glass sealing part 6 and the LED element 202 have substantially the same thermal expansion coefficients, the mounting state of the LED element 202 can be balanced even under the thermal stress after the sealing process. Therefore, even the two point bump bonding can yield a sufficient bonding reliability. The p-side pad electrode 226 only has to have an area corresponding to one point bump. Thus, light absorption by the p-side pad electrode is reduced advantageously in optical aspect so that the light extraction efficiency can be enhanced. In this context, the light emitting device 1 of the first and second embodiments may be alternatively composed by two point bump bonding (i.e., one for the p-side and the other for the n-side) by adapting the composition of the LED element 202 of the third embodiment.

Although in the third embodiment the light emitting device 201 yields white light by the combination of the blue LED element 202 and the yellow phosphor 7, it may yield white light by the combination of the blue LED element 202, a green phosphor and a red phosphor or may yield another emission color other than the white light. Especially in the case where plural kinds of phosphor is used and the circuit pattern 4 is formed of gold on the top layer, the phosphor coated on the circuit pattern 4 is desirably to emit only light with a wavelength of 550 nm or more in order to enhance the light extraction efficiency.

Figure 14:
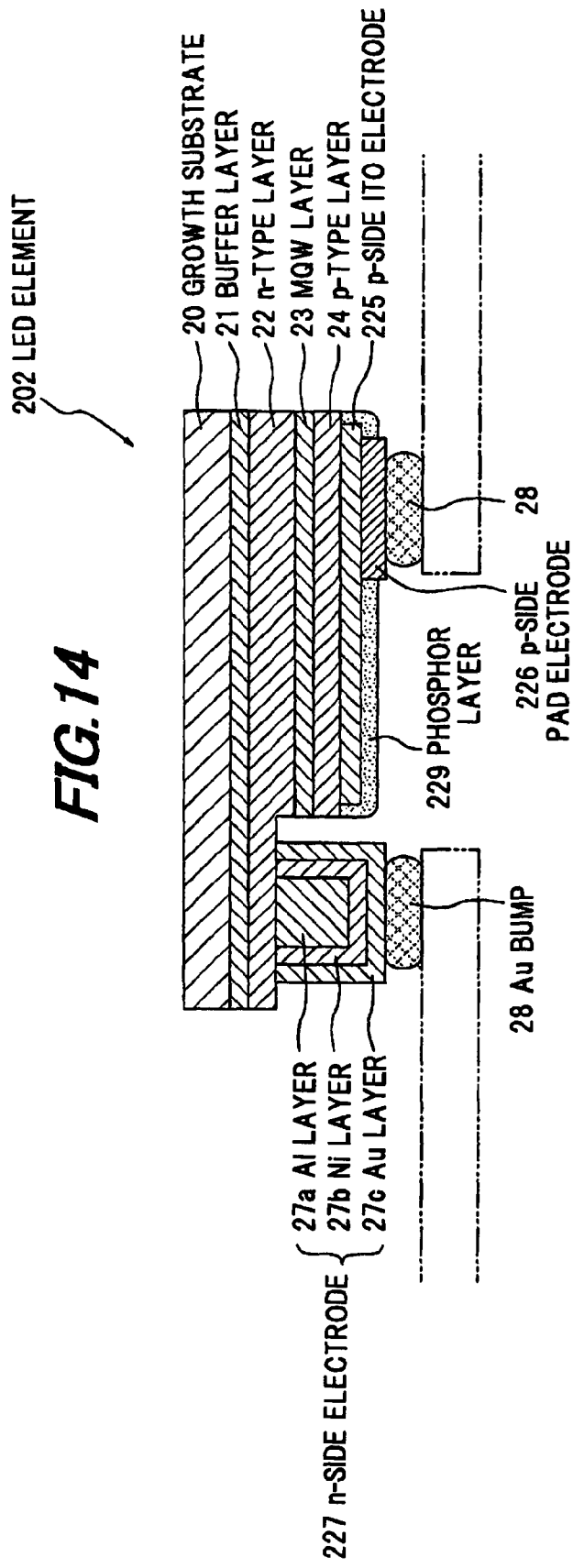
FIG. 14 is a schematic cross sectional view showing an LED element in a modification of the light emitting device of the third embodiment according to the invention.
Figure 15:
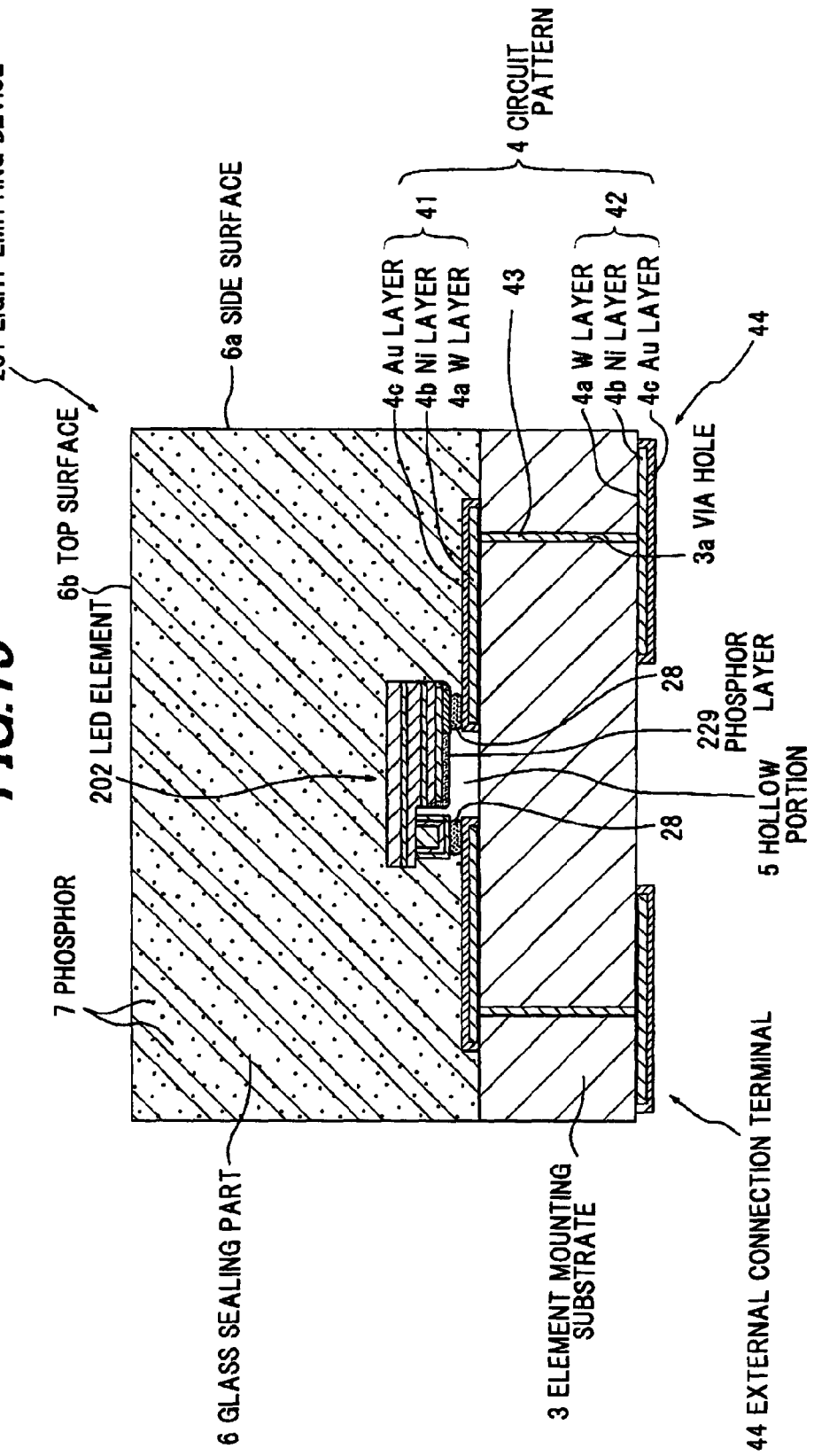
FIG. 15 is a schematic cross sectional view showing the modification of the light emitting device of the third embodiment according to the invention.

Although in the third embodiment the phosphor layer 209 is formed on the element mounting substrate 3, a phosphor layer 229 as shown in FIG. 14 may be formed on the p-side ITO electrode 225. In other words, as exemplified in FIG. 14, some phosphor layer only has to be disposed between the MQW layer 23 and the circuit pattern 4. As shown in FIG. 15, by forming the phosphor layer 229 on the p-side ITO electrode 225, incident light into the surface pattern 41 of the element mounting substrate 3 can be converted into yellow light without the phosphor layer 209 formed on the element mounting substrate 3. The phosphor layer 229 can be formed by sputtering.

Especially when the hollow portion 5 (a space) is left between the p-side ITO electrode 225 and the element mounting substrate 3, light emitted to the side of the element mounting substrate 3 will be largely reflected thereon without reaching the phosphor layer 209 and returned to the LED element 202 directly as blue light if there is not provided the phosphor layer 229. In this embodiment, since the phosphor layer 229 is formed on the p-side ITO electrode 225, most of light emitted to the element mounting substrate 3 can be converted into yellow light by the phosphor layer 229 and returned to the LED element 202. Therefore, light absorption by the epitaxial layer and electrodes of the LED element 202 can be reduced to enhance the light extraction efficiency of the light emitting device 201.

Fourth Embodiment

Figure 16:
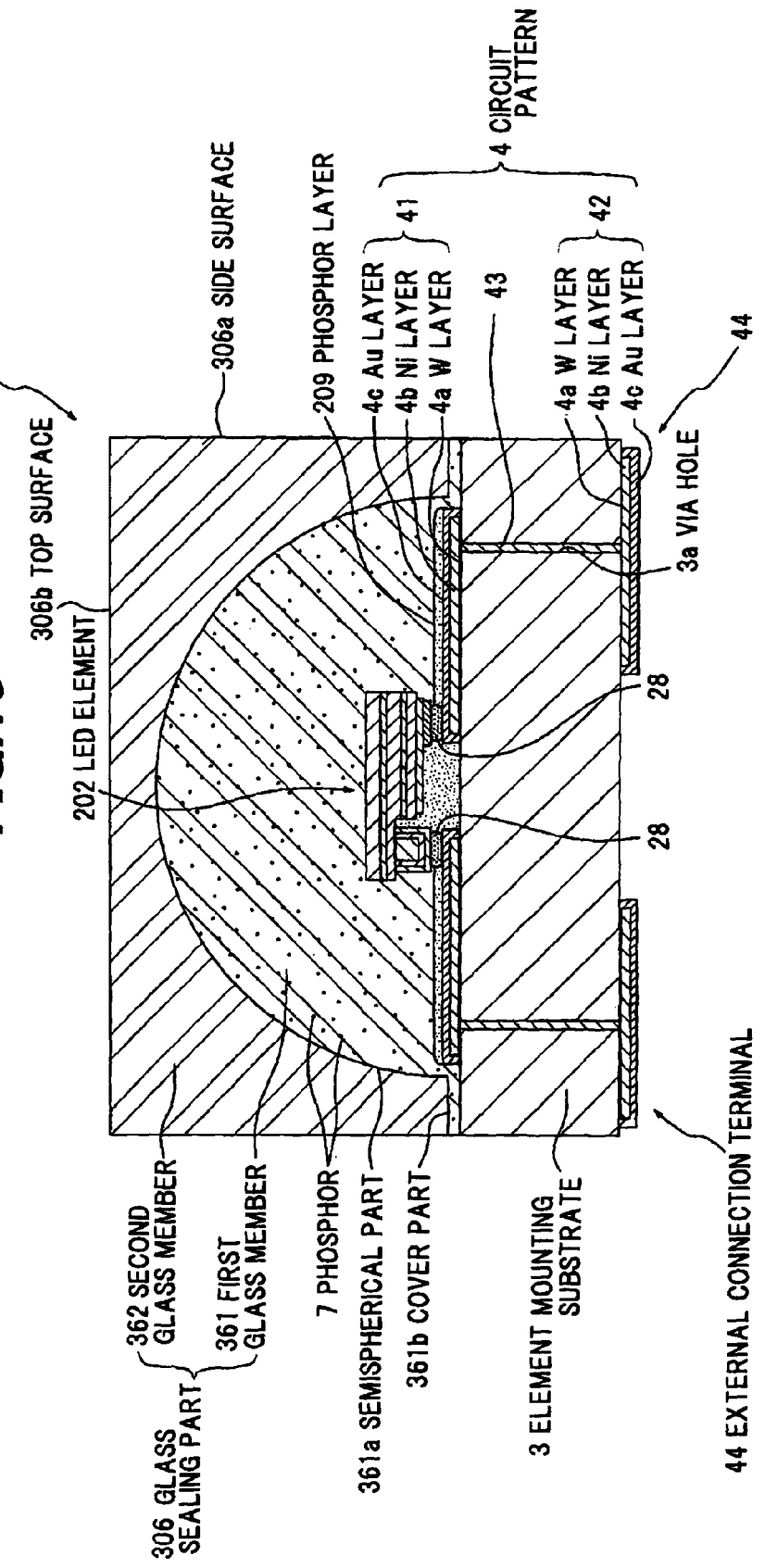
FIG. 16 is a schematic cross sectional view showing a light emitting device in a fourth preferred embodiment according to the invention.

FIG. 16 shows a light emitting device 301 in the fourth preferred embodiment according to the invention. Hereinafter, like components are indicated by the same numerals as used in the preceding embodiments, and duplicate explanation thereof is omitted below. Unlike the third embodiment, the fourth embodiment is composed such that a glass sealing part 306 is composed of two glass members.

As shown in FIG. 16, the light emitting device 301 is composed of the flip-chip type LED element 202 formed of a GaN based semiconductor material, an element mounting substrate 3 to mount the LED element 202 thereon, a circuit pattern 4 formed on the element mounting substrate 3 and formed of tungsten (W)-nickel (Ni)-gold (Au), the glass sealing part 306 to seal the LED element 202, being bonded to the element mounting substrate 3 and containing a phosphor 7 therein, and the phosphor layer 209 covering a predetermined region on the element mounting substrate 3.

The glass sealing part 306 is composed of a first glass member 361 and a second glass member 362 formed on the element mounting substrate 3, where the phosphor 7 is included in the first glass member 361. The element mounting substrate 3, the first glass member 361 and the second glass member 362 have side faces aligned one another. Thus, the light emitting device 301 is formed rectangular solid on the whole, and has a top surface 306b formed parallel to the element mounting substrate 3 and a side surface 306a formed perpendicular to the top surface 306b by being cut by the dicer. The interface of the first glass member 361 and the second glass member 362 is formed convex upward in the cross section.

The first glass member 361 is formed of a $ZnO-B_2O_3-SiO_2-Nb_2O_5-Na_2O-Li_2O$ based heat melting glass, and is composed of a semispherical part 361a with the LED element 202 located at the center and a cover part 361b formed outside the semispherical part 361a (when viewed from the top) to cover the element mounting substrate 3. Like the heat melting glass of the first embodiment, the heat melting glass composing the first glass member 361 has a glass transition temperature (Tg) of 490° C., a deformation point (At) of 520° C., a thermal expansion coefficient ($\alpha$) of $6 \times 10^{-6}$/° C. in the range of 100 to 300° C., and a refractive index (n) of 1.7.

The second glass member 362 is formed of $SiO-B_2O_3$ based heat melting glass, and formed on the first glass member 361 to provide its outer shape with rectangular solid. The second glass member 362 has a higher glass transition temperature (Tg) than the first glass member 361, whereby its mold releasing property can be enhanced. For example, the second glass member 362 has a glass transition temperature (Tg) of 560° C. Further, the second glass member 362 has thermal properties such as glass transition temperature (Tg) higher than the first glass member 361, and is more excellent in humidity resistance, acid resistance and alkali resistance than the first glass member 361. The second glass member 362 may be made of $SiO-B_2O_3$ based $SiO-B_2O_3-Al_2O_3$ based, $SiO-Al_2O_3$ based, $SiO-R_2$ based (where R is Li, Na, K etc.), and a glass material with the other composition.

The second glass member 362 has a thermal expansion coefficient ($\alpha$) of $7 \times 10^{-6}$/° C. in the range of 100 to 300° C. The second glass member 362 has a refractive index (n) of 1.5. The second glass member 362 has the top surface 306b formed parallel to the mounting surface of the element mounting substrate 3.

The light emitting device 301 thus composed can have the following effects as well as the effects of the third embodiment. Since the first glass member 361 is formed semispherical with the LED element 202 at the center, optical path lengths in the first glass member 361 can be substantially uniformed with respect to light emitted from the LED element 202. Therefore, the emitted light can be uniformly wavelength-converted regardless of the radiation angle so that unevenness in emission color can be further prevented.

Since the element mounting substrate 3 is covered with the first glass member 361 and the second glass member 362 has the high mold-releasing property, the processing conditions such as temperature and pressure can be widened that are imposed on the first and second glass members 361, 362 during the hot pressing. Thus, the formation process of the glass sealing part 306 can be facilitated. Further, since the unnecessary adherence of the glass sealing part 306 to the upper mold 92 can be prevented as well as the bonding failure of the glass sealing part 306 to the element mounting substrate 3, the reduction of production yield can be prevented effectively.

Furthermore, the second glass member 362 with more excellent humidity resistance, acid resistance and alkali resistance than the first glass member 361 is disposed on the top portion of the glass sealing part 306 where the amount of external radiation light from the LED element 202 is relatively large. Therefore, the deterioration of the top portion of the glass sealing part 306 can be effectively prevented. Thus, the deterioration of light extraction efficiency with time of the light emitting device 301 can be prevented.

Fifth Embodiment

Figure 17:
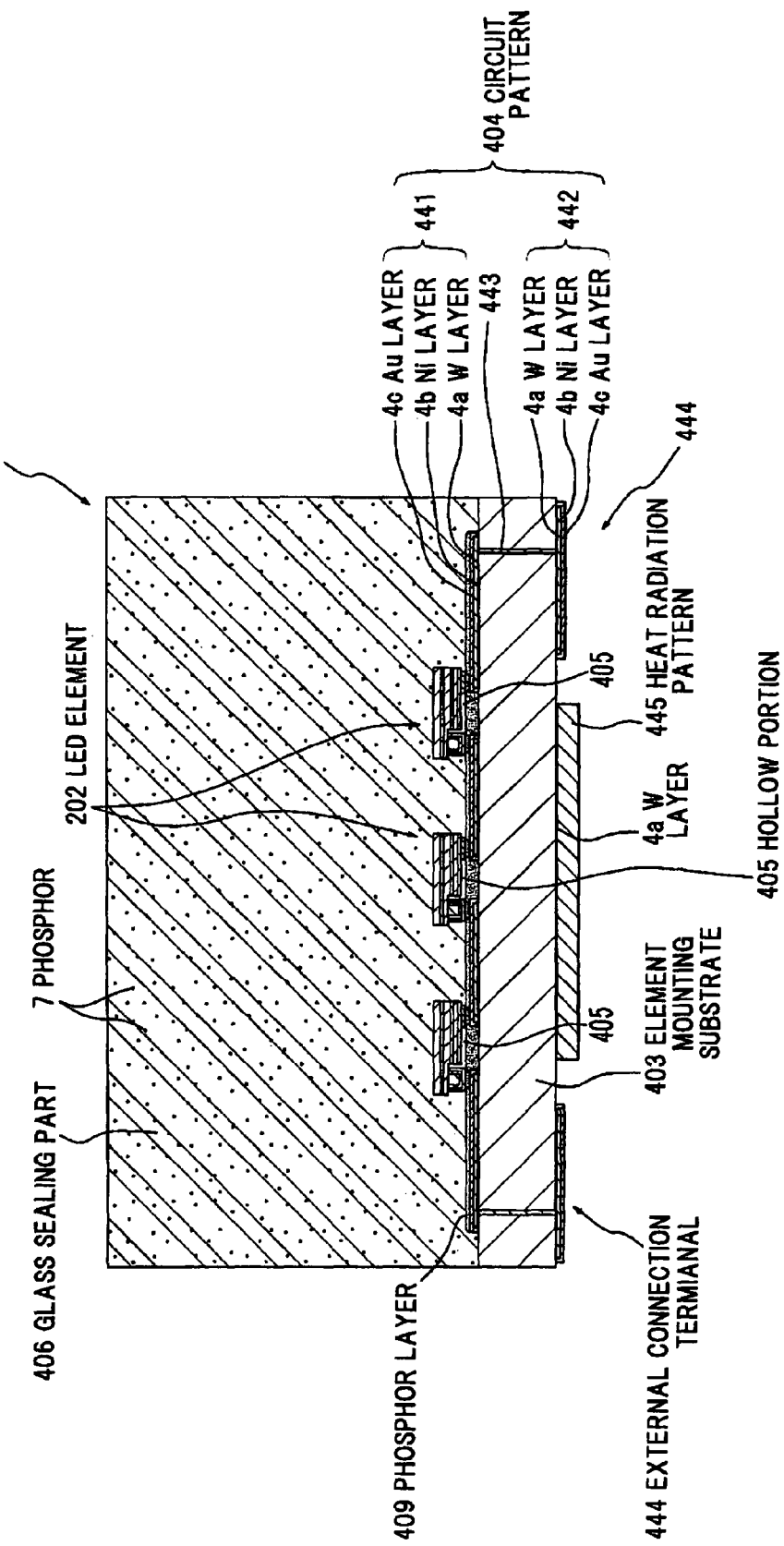
FIG. 17 is a schematic cross sectional view showing a light emitting device in a fifth preferred embodiment according to the invention.
Figure 18:
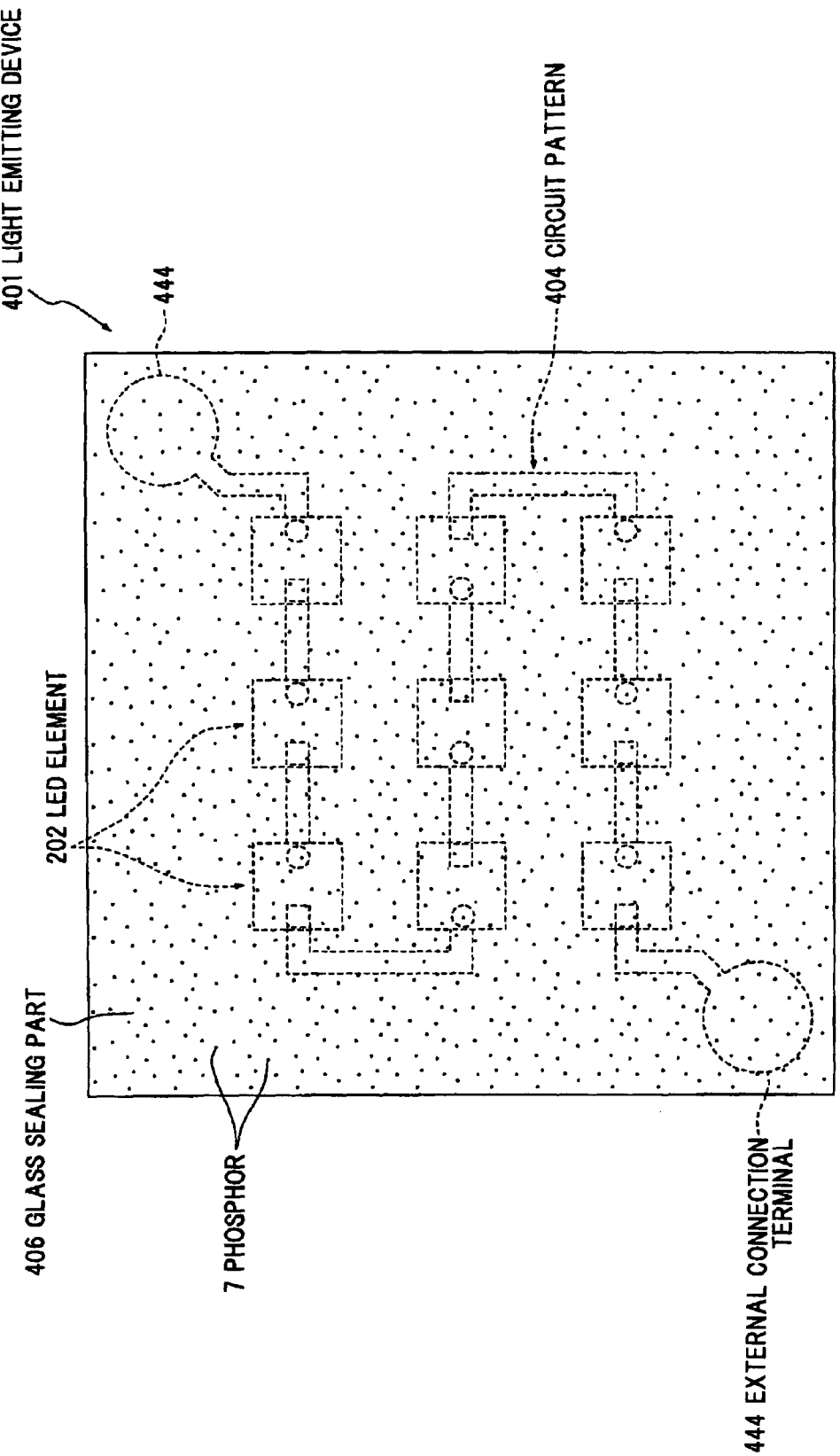
FIG. 18 is a schematic top view showing a circuit pattern formed on the element mounting substrate in FIG. 17.

FIG. 17 is a schematic cross sectional view showing a light emitting device 401 in the fifth preferred embodiment according to the invention. FIG. 18 is a schematic top view showing a circuit pattern formed on the element mounting substrate in FIG. 17. Hereinafter, like components are indicated by the same numerals as used in the preceding embodiments, and duplicate explanation thereof is omitted below.

As shown in FIG. 17, the light emitting device 401 is composed of plural flip-chip type GaN based LED elements 202, and a multilayer element mounting substrate 403 to mount the plural LED elements 202 thereon. The light emitting device 401 is further composed of a circuit pattern 404, where a surface pattern 441, a back surface pattern 442 and a via pattern 443 are formed on the top surface, back surface and inside, respectively, of the element mounting substrate 403. A hollow portion 405 into which the sealing glass is not penetrated is formed between the LED element 202 and the element mounting substrate 403.

The surface pattern 441 and the back surface pattern 442 are each composed of a W layer 4a formed on the element mounting substrate 403, and a Ni thin layer 4b and an Au thin layer 4c formed on the surface of the W layer 4a by plating. The element mounting substrate 403 is covered with a phosphor layer 409 in a given area thereof. A heat radiation pattern 445 is formed on the opposite side of the mounting surface of the element mounting substrate 403 so as to externally radiate heat generated from the LED elements 202. The heat radiation pattern 445 is produced by the same process as the back surface pattern 442 and includes the W layer 4a.

The light emitting device 401 is further composed of a glass sealing part 406 to seal the LED elements 202, being bonded to the element mounting substrate 403 and containing a phosphor 7 therein.

As shown in FIG. 18, the nine LED elements 202 to emit blue light are mounted 3×3 in the length and width directions on the one element mounting substrate 403. In this embodiment, the LED elements 202 are arranged at intervals of 600 μm in the length and width directions. The p-side electrode of each of the LED elements 202 is, as shown FIG. 11, composed of the p-side ITO electrode 225 and the p-side pad electrode 226 formed thereon sequentially. The LED element 202 is formed 100 μm thick and 340 μm square, and has a thermal expansion coefficient ($\alpha$) of $7 \times 10^{-6}/°$ C.

The element mounting substrate 403 is formed of polycrystalline alumina ($Al_2O_3$) sintered material, formed 0.25 mm thick and has a thermal expansion coefficient of $7 \times 10^{-6}/°$ C. The element mounting substrate 403 is formed 2.5 mm square (when viewed from the top). The LED elements 202 are electrically series connected each other by the circuit pattern 404. The back surface pattern 442 of the circuit pattern 404 has two external connection terminals 444 disposed diagonally near the corner (i.e., upper right and lower left in FIG. 18) of the light emitting device 401. By applying a voltage between the external connection terminals 444, the nine LED elements 202 can emit light. The surface pattern 441 of the circuit pattern 404 is formed by a 0.1 mm wide fine wire pattern.

The glass sealing part 406 is formed of a $ZnO-B_2O_3-SiO_2-Nb_2O_5-Na_2O-Li_2O$ based heat melting glass in which the phosphor 7 is dispersed uniformly. The glass sealing part 406 is also formed by bonding the plate phosphor dispersed glass produced from the mixed powder of the phosphor and the glass onto the element mounting substrate 403 by the hot pressing as conducted in the first embodiment.

As shown in FIG. 17, the glass sealing part 406 is formed rectangular solid on the element mounting substrate 403 and has a thickness of 1.2 mm. A side 406a of the glass sealing part 406 is formed by cutting by a dicer the element mounting substrate 403 with the plate glass bonded to the element mounting substrate 403 by the hot pressing. A top surface 406b of the glass sealing part 406 composes a surface of the plate glass bonded to the element mounting substrate 403 by the hot pressing.

The heat melting glass has a glass transition temperature (Tg) of 490° C. and a deformation point (At) of 520° C., where the glass transition temperature (Tg) is sufficiently low as compared to the formation temperature of the epitaxial growth layer of the LED element 202. In this embodiment, the glass transition temperature (Tg) is 200° C. or more lower than the formation temperature of the epitaxial growth layer. The heat melting glass has a thermal expansion coefficient ($\alpha$) of $6 \times 10^{-6}/°$ C. in the range of 100 to 300° C. The thermal expansion coefficient ($\alpha$) becomes larger than this as the processing temperature is beyond the glass transition temperature (Tg). Thus, the heat melting glass is bonded to the element mounting substrate 403 at about 600° C. so as to allow the hot pressing. The heat melting glass of the glass sealing part 406 has a refractive index of 1.7.

The phosphor layer 409 is formed of a ZnO based glass, and includes a yellow phosphor to emit a yellow light with a peak wavelength in yellow wavelength region by being excited blue light emitted from the LED element 202. The phosphor layer 409 is coated by high temperature melting process before the LED elements 202 are mounted on the element mounting substrate 403.

The light emitting device 401 thus composed can have the following effects. Although the plural LED elements 202 are compactly mounted on the one element mounting substrate 403, the light emitting device 401 can have good reliability without generating cracks since the LED element 202 and the glass sealing portion 406 has substantially the same thermal expansion coefficient. Further, good bonding strength can be secured between the glass sealing portion 406 and the element mounting substrate 403 since they have substantially the same thermal expansion coefficient.

By using the element mounting substrate 403 of $Al_2O_3$, a stable heat radiation performance can be obtained even when the GaN based LED elements 202 to cause a large heat generation are compactly mounted. The serial circuit can be easily patterned and the wiring can be easily drawn for conducting the electrolysis plating. Here, although gold is as low as 40% in reflectivity to blue light (460 nm), the surface pattern 41 with the Au top layer is formed into a 0.1 mm wide fine wire and the hollow portion 405 is left between the LED element 202 and the element mounting substrate 403. Thereby, loss (due to light absorption) of blue light entering to the element mounting substrate 403 from the LED element 202 can be minimized.

Adding to the phosphor layer 7 included in the glass sealing part 406, the phosphor layer 409 is formed on the element mounting substrate 403 to covert the blue light into a yellow light. Therefore, even when the phosphor content of the glass to seal the LED element is low, white light can be sufficiently produced. Especially in case of using plural LED elements, even when the ratio of thickness and width in the glass sealing part 406 is imbalanced, unevenness in emission color can be effectively suppressed although it may be caused by the difference of optical path length in the glass sealing part 406.

By the heat radiation pattern 445 disposed on the back surface of the element mounting substrate 403, heat generated during the emission of the nine LED elements 2 mounted compactly can be rapidly conducted through the heat radiation pattern 445 to a heat sink etc.

Sixth Embodiment

Figure 19:
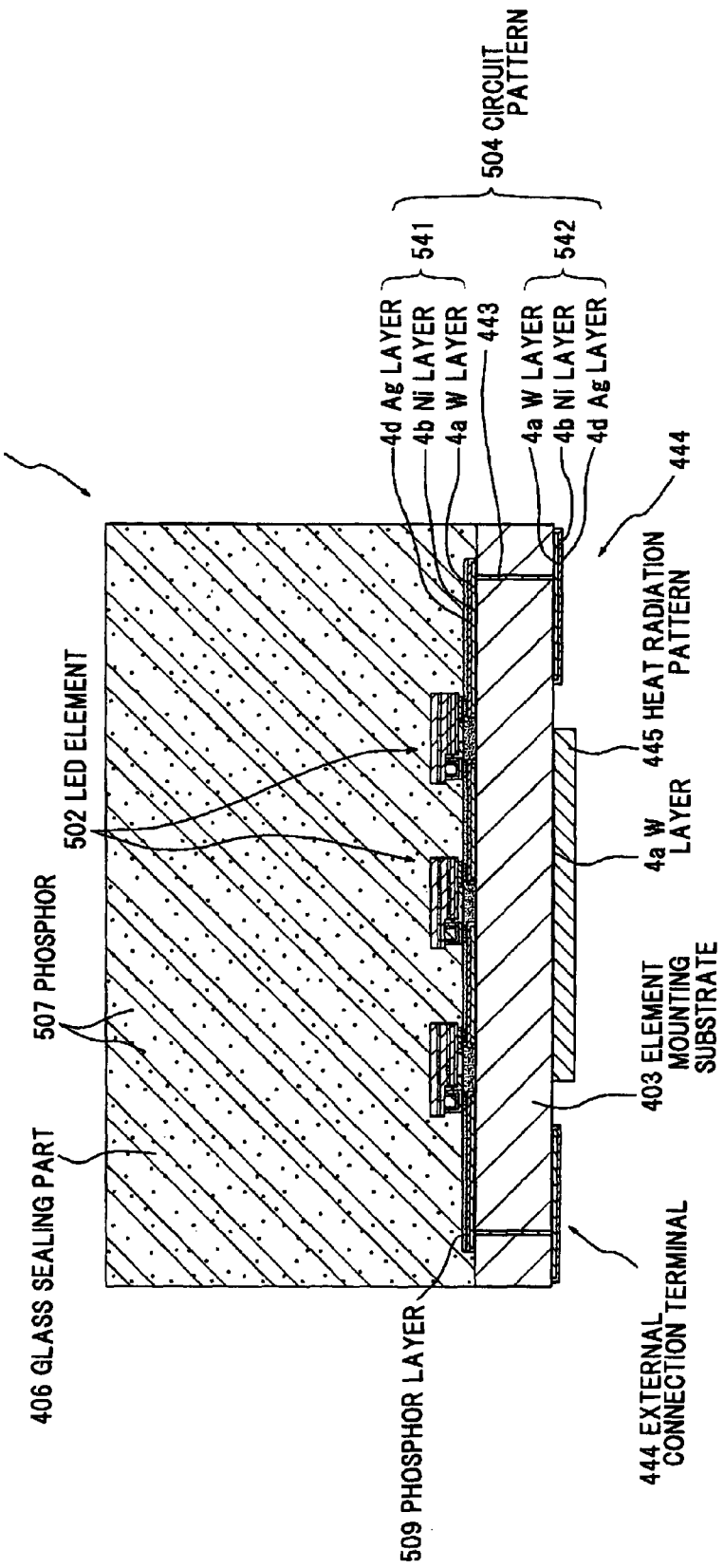
FIG. 19 is a schematic cross sectional view showing a light emitting device in a sixth preferred embodiment according to the invention.
Figure 20:
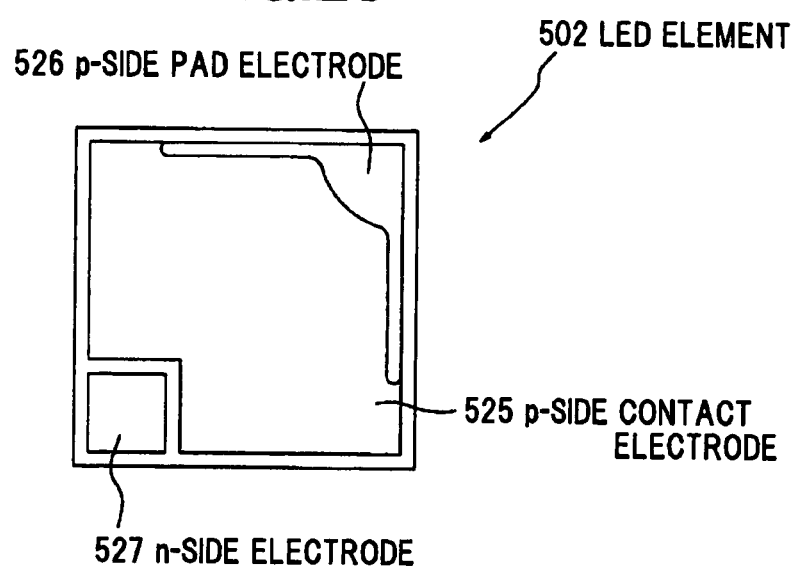
FIG. 20 is a schematic top view showing an electrode formation surface of an LED element in FIG. 19.
Figure 21:
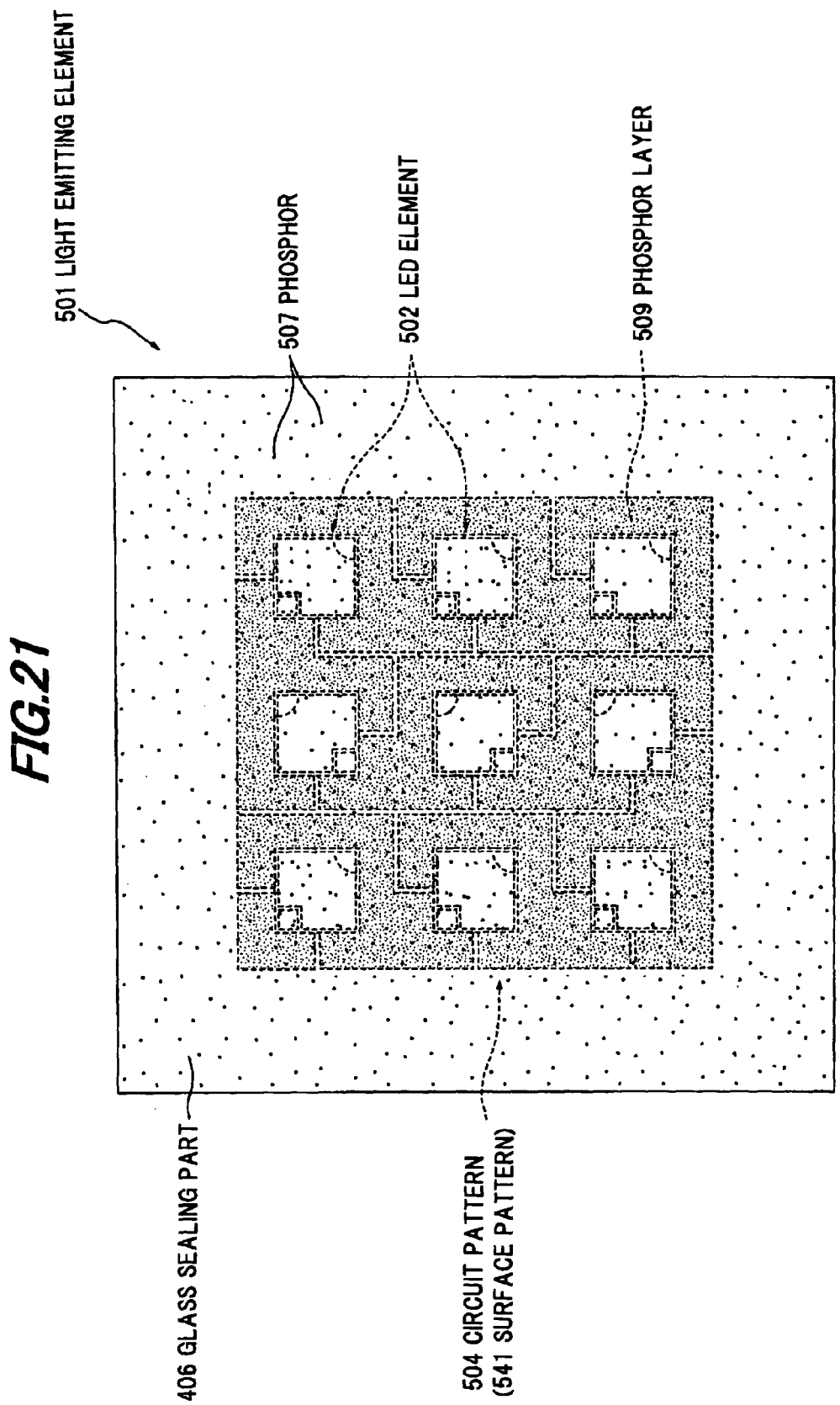
FIG. 21 is a schematic top view showing a circuit pattern formed on the element mounting substrate in FIG. 19.

FIGS. 19 to 21 illustrate the six preferred embodiment of the invention.

FIG. 19 is a schematic cross sectional view showing a light emitting device 501 in the sixth preferred embodiment according to the invention. FIG. 20 is a schematic top view showing an electrode formation surface of an LED element 502 in FIG. 19.

FIG. 21 is a schematic top view showing a circuit pattern formed on the element mounting substrate 403 in FIG. 19. Hereinafter, like components are indicated by the same numerals as used in the preceding embodiments, and duplicate explanation thereof is omitted below.

As shown in FIG. 19, the light emitting device 501 is composed of plural flip-chip type GaN based LED elements 202 with a peak wavelength of 390 nm, and a multilayer element mounting substrate 403 to mount the plural LED elements 502 thereon. The light emitting device 501 is further composed of a circuit pattern 504, where a surface pattern 541, a back surface pattern 542 and a via pattern 443 are formed on the top surface, back surface and inside, respectively, of the element mounting substrate 403.

The surface pattern 541 and the back surface pattern 542 are each composed of a W layer 4a formed on the element mounting substrate 403, and a Ni thin layer 4b and an Ag thin layer 4d formed on the surface of the W layer 4a by plating. The element mounting substrate 403 is covered with a phosphor layer 509 in a given area thereof. A heat radiation pattern 445 is formed on the opposite side of the mounting surface of the element mounting substrate 403 so as to externally radiate heat generated from the LED elements 502. The heat radiation pattern 445 is produced by the same process as the back surface pattern 542 and includes the W layer 4a.

The light emitting device 501 is further composed of a glass sealing part 406 to seal the LED elements 502, being bonded to the element mounting substrate 403 and containing a phosphor 507 therein.

As shown in FIG. 20, in each of the LED elements 502, an n-side electrode 527 is formed on the corner of the electrode formation surface of the LED element 502, and the p-side contact electrode 525 is formed on substantially the entire electrode formation surface except the formation area of the n-side electrode 527 (when viewed from the top). In this embodiment, a p-pad electrode 526 is formed on the p-side contact electrode 525 and diagonally to the n-side electrode 527 at the corner opposite thereto, where the p-pas electrode 526 is formed with an L-shaped current spreading thin pattern (See FIG. 20).

As shown in FIG. 21, the nine LED elements 502 to emit near ultraviolet light are mounted 3×3 in the length and width directions on the one element mounting substrate 403. In this embodiment, white light externally radiated is yielded by the combination of the LED element 502 to emit near ultraviolet light and the phosphor layer 507 to emit blue light, green light and red light by being excited by the ultraviolet light. The LED element 502 is formed 100 μm thick and 340 μm square, and has a thermal expansion coefficient ($\alpha$) of $7\times10^{-6}$/° C.

The element mounting substrate 403 is formed of polycrystalline alumina ($Al_2O_3$) sintered material, formed 0.25 mm thick and has a thermal expansion coefficient of $7\times10^{-6}$/° C. The element mounting substrate 403 is formed 2.5 mm square (when viewed from the top). As shown in FIG. 21, the LED elements 502 are electrically series connected each other by the surface pattern 541, where the three LED elements 502 arrayed in the vertical direction are series connected each other, and the three columns of LED element 502 arrayed in the horizontal direction are series connected each other. The back surface pattern 542 of the circuit pattern 504 has two external connection terminals 544 disposed diagonally near the corner (not shown in FIG. 21) of the light emitting device 501. By applying a voltage between the external connection terminals 544, the nine LED elements 502 can emit light. The surface pattern 541 of the circuit pattern 504 is formed overall in a square region on the element mounting substrate 403 which is sectioned and isolated by a 0.75 mm wide gap as shown by dotted lines in FIG. 21.

Although in this embodiment, as shown in FIG. 21, all the LED elements 502 are series connected, they may be connected otherwise. For example, the three LED elements 502 arrayed in the vertical direction may be parallel connected each other and the three columns of LED element 502 arrayed in the horizontal direction may be series connected. In this case, one p-side connection terminal can be provided for a wiring merging the p-side circuit pattern ends of the three columns of LED element 502 and one n-side connection terminal can be provided for a wiring merging the n-side circuit pattern ends of the three columns of LED element 502. Thus, the p-side connection terminal and the n-side connection terminal, two terminals in total, may be each disposed at two opposite sides or diagonal corners on the back of the rectangular element mounting substrate 403. Alternatively, only one of the p-side circuit pattern ends or the n-side circuit pattern ends may be together connected to one external connection terminal and the other may be each connected to three external terminals provided for the series connected circuits, respectively. In this case, the p-side and n-side connection terminals, four terminals in total, may be each disposed at four corners on the back of the rectangular element mounting substrate 403.

The glass sealing part 406 is formed of a $ZnO$—$B_2O_3$—$SiO_2$—$Nb_2O_5$—$Na_2O$—$Li_2O$ based heat melting glass in which the phosphor 507 is dispersed uniformly. The glass sealing part 406 is also formed by bonding the plate phosphor dispersed glass produced from the mixed powder of the phosphor and the glass onto the element mounting substrate 403 by the hot pressing as conducted in the first embodiment.

The heat melting glass has a glass transition temperature (Tg) of 490° C. and a deformation point (At) of 520° C., where the glass transition temperature (Tg) is sufficiently low as compared to the formation temperature of the epitaxial growth layer of the LED element 502.

The phosphor 507 includes a blue phosphor to emit blue light with a peak wavelength in the blue spectral region, a green phosphor to emit green light with a peak wavelength in the green spectral region, and a red phosphor to emit red light with a peak wavelength in the red spectral region, where these phosphors are excited by near-ultraviolet light emitted from the LED element 502.

The phosphor layer 509 is formed of a ZnO based glass, and includes a blue phosphor to emit blue light with a peak wavelength in the blue spectral region, a green phosphor to emit green light with a peak wavelength in the green spectral region, and a red phosphor to emit red light with a peak wavelength in the red spectral region, where these phosphors are excited by near-ultraviolet light emitted from the LED element 502.

The phosphor layer 509 is coated by high temperature melting process before the LED elements 502 are mounted on the element mounting substrate 403. In this embodiment, as shown in FIG. 21, the phosphor layer 509 is formed 1.8 mm square at the center of the element mounting substrate 403 formed 2.5 mm square (when viewed from the top).

The light emitting device 501 thus composed operates as follows. When a voltage is applied to the LED elements 502 through the circuit pattern 504, the LED elements 502 each emit near-ultraviolet light. The near-ultraviolet light emitted from the LED elements 502 is converted into blue light, green light and red light by the phosphor 507 included in the glass sealing part 406, and externally discharged from the glass sealing part 406. Thus, the light discharged from the glass sealing part 406 has the peak wavelengths in the blue spectral region, green spectral region and red spectral region, respectively, so that white light is externally radiated out of the device. Although in general the specific gravity of the blue, green and red phosphors is different from each other, the phosphor layer 507 included in the glass sealing part 406 can be dispersed uniformly due to the mixed powder production process. Therefore, unevenness in emission color can be prevented that may be caused by the precipitation (or sedimentation) of the phosphor with a high specific gravity.

Since the phosphor layer 509 is formed on the element mounting substrate 403, the near-ultraviolet light emitted from the LED element 502 to the element mounting substrate 403 can be irradiated as incident light onto the surface pattern 541 while being wavelength-converted into the blue, green and red lights. Here, since the top layer of the surface pattern 541 is the Ag layer 4d and the incident light is converted into long wavelength visible region light, the incident light can be sufficiently reflected by the Ag layer 4d with a high reflectivity although the Ag layer 4d has a relatively low reflectivity in the ultraviolet region. Since Ag is more than twice in reflectivity to blue light region higher than Au, the reflection efficiency of blue light can be enhanced. Thus, the light extraction efficiency of the light emitting device 501 can be enhanced. Even when the p-contact electrode is formed with the transparent electrode, light passing through there can be reflected surely by the surface pattern 541. As such, the freedom in choice of the p-contact electrode can be enhanced.

In this embodiment, about 50% of the mounting surface of the element mounting substrate 403 is covered by the circuit pattern 504. Meanwhile, when the LED elements 502 are compactly mounted in consideration of the mounting precision thereof and the via pattern 443 is disposed around the LED elements 502, the same area as this embodiment of the element mounting substrate 403 will be covered thereby. In forming the circuit pattern 504 to have a width twice that of the LED element 502 in relation to the position of each LED element 502, more than about 40% of the mounting surface of the element mounting substrate 403 can be covered by Ag. Thus, by covering the more than about 40% of the mounting surface of the element mounting substrate 403 with Ag, light emitted from the LED element 502 can be efficiently reflected.

The Ag plating is sealed by the alumina (i.e., element mounting substrate 403) and the glass (i.e., glass sealing part 406). Therefore, Ag blackening caused by oxidation or electromigration caused by humidity, voltage etc. can be prevented that may be caused when it is sealed by a moisture permeable resin.

In this embodiment, since the LED element 502 has substantially the same thermal expansion coefficient as the glass sealing part 406, no cracks will be caused. Further, since the glass sealing part 406 has substantially the same thermal expansion coefficient as the element mounting substrate 403, the glass bonding strength can be enhanced. Heat generated during the emission of the nine LED elements 502 can be rapidly conducted through the heat radiation pattern 445 to a heat sink etc.

Although in the sixth embodiment the LED element 502 to emit near-ultraviolet light is combined with the phosphor 507 to emit blue, green and red lights to produce white light, the LED element 502 to emit near-ultraviolet light may be combined with a monochromatic phosphor to produce white light.

In case of using a blue LED element, about a half of the blue light only has to be converted into yellow light by a yellow phosphor to produce white light efficiently. However, because of using the near-ultraviolet light in the sixth embodiment, all the near-ultraviolet light needs to be converted into blue, green and red lights. In this regard, if the phosphor layer 509 is not used, the phosphor concentration of the glass sealing part 506 needs to be increased so that the light confinement loss can be caused due to the increased phosphor concentration. In this embodiment, such a loss can be prevented by using the phosphor layer 509.

It is not always necessary to provide the glass sealing part 506 and the phosphor layer 509 with the same phosphor composition. For example, the phosphor composition may be such that the glass sealing part 506 includes the phosphor 507 to emit blue and green lights and the phosphor layer 509 includes a phosphor to emit red light. In brief, the phosphor layer 509 only needs to include a phosphor that emits light with absorption loss in the LED element 502 lower than light emitted from the LED element 502, whereby the light extraction efficiency can be enhanced. In case of using gold (Au) for the electrodes of the LED element 502 or the surface pattern 541 of the element mounting substrate 403, it is desired that the phosphor layer 509 includes a phosphor to emit light with a wavelength of 550 nm or more where the reflectivity of gold can be more than 80%.

Modifications

In the first to sixth embodiments, the light emitting device is produced such that the plate phosphor dispersed glass is made from the mixed powder of phosphor and glass, and it is then bonded to the element mounting substrate by hot pressing.

Figure 22:
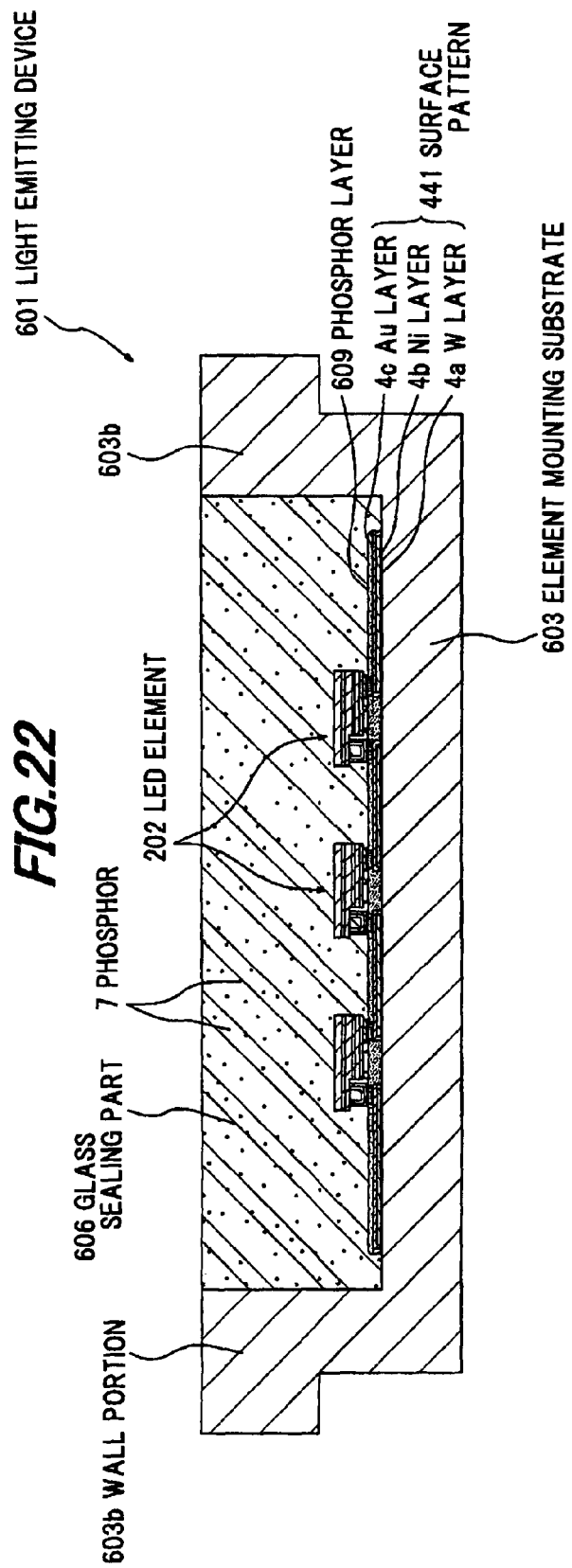
FIG. 22 is a schematic cross sectional view showing a light emitting device in a modification according to the invention.
Figure 23:
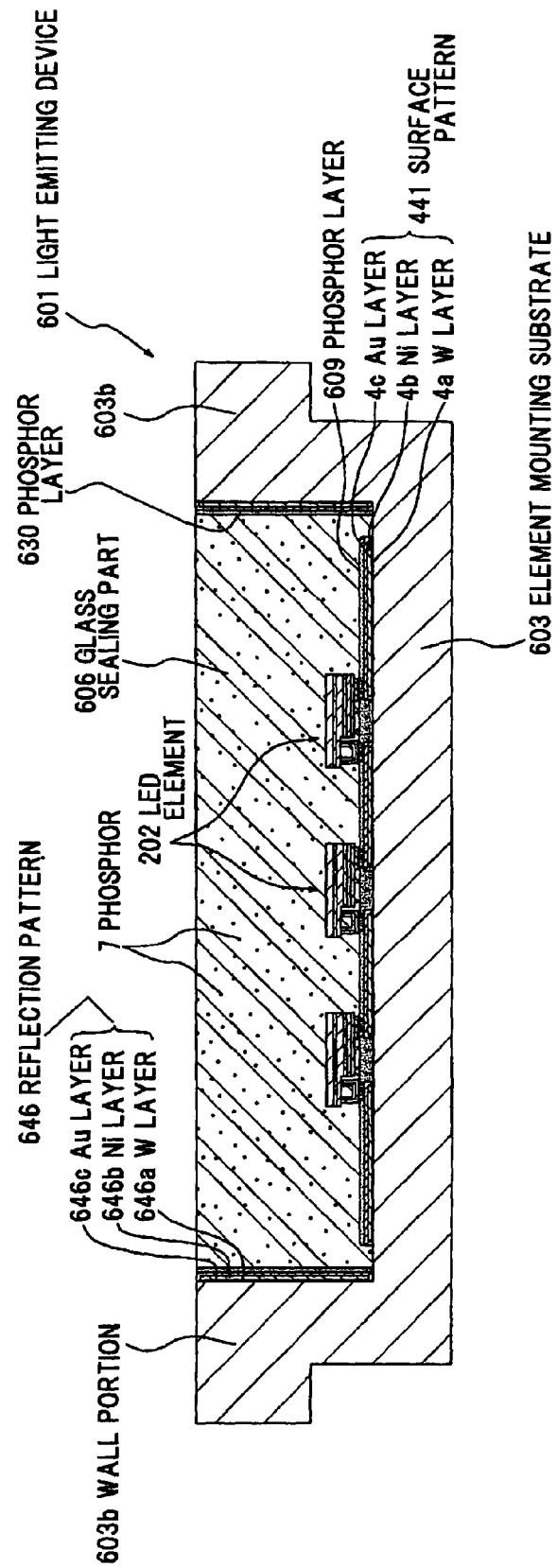
FIG. 23 is a schematic cross sectional view showing a light emitting device in another modification according to the invention.

Alternatively, for example, as shown in FIGS. 22 and 23, the light emitting device may be produced such that, after the mixing step for preparing the mixed powder, the mixed powder is melted in decompression high-temperature atmosphere and then solidified on an element mounting substrate 603 to produce a phosphor dispersed glass, the LED elements 202 are sealed by the phosphor dispersed glass being bonded to the element mounting substrate 603. Thus, by melting and solidifying the glass on the element mounting substrate 603, freedom in shaping the glass sealing part can be enhanced higher than in case of using the plate glass.

As shown in FIG. 22, the light emitting device 601 is composed such that a wall portion 603b is formed at the outer side of the element mounting substrate 603 to surround the LED elements 202. The inner surface of the wall portion 603b forms a reflection surface in relation to light emitted from the LED element 202. The outside of the wall portion 603b protrudes outward like an overhang, and the external connection terminal (not shown) is formed at the bottom surface of the protrusion. Further, the surface pattern 441 composed of the W layer 4a, Ni layer 4b and Au layer 4c is formed on the element mounting substrate 603, and a phosphor layer 609 including a yellow phosphor is formed on the surface pattern 441. A glass sealing part 606 with the phosphor 7 uniformly dispersed therein is filled inside the wall portion 603b.

Although the light emitting device 601 as shown in FIG. 22 is designed such that the top surface of the glass sealing part 606 is formed flat to be even with the top face of the wall portion 603b, the top surface of the glass sealing part 606 may be formed convex upward like a lens.

In the light emitting device 601, the mixed powder of phosphor and glass is arranged inside the wall portion 603b of the element mounting substrate 603 with the LED elements 202 mounted thereon. Then, the mixed powder is melted in the decompression atmosphere and solidified to form the glass sealing part 606 to seal the LED elements 202. Thus, the light emitting device 601 can operate such that light from the LED elements 202 is wavelength-converted by the phosphor dispersed uniformly in the glass sealing part 606. In case of forming the wall portion 603b, the bonding strength between the glass sealing part 606 and the element mounting substrate 603 need not be so increased. However, a pressurization process may be conducted so as to reduce the size of remaining bubbles or to form the top of the glass sealing part 606 into a desired shape.

As shown in FIG. 23, the light emitting device 601 is composed such that a reflection pattern 646 composed of a W layer 646a, Ni layer 646b and Au layer 646c is formed on the inner surface of the wall portion 603b. Further, a phosphor layer 630 including a yellow phosphor is formed on the reflection pattern 646. Thus, incident light to the wall portion 603b can be also wavelength-converted into yellow light and then entered into the Au layer 646c of the reflection pattern 646, as in the circuit pattern 441.

Although in the first to sixth embodiments the element mounting substrate is formed of alumina ($Al_2O_3$), it may be formed of ceramics other than the alumina. For example, BeO (thermal expansion coefficient ($\alpha$): $7.6\times10^{-6}/°$ C., thermal conductivity: 250 W/(m·k)) may be used which is a ceramic substrate with thermal conductivity higher than the alumina. The BeO substrate can yield a good sealing property with the phosphor dispersed glass.

The other thermal conductivity substrates available can be a W—Cu substrate. The W—Cu substrate includes a W90—Cu10 substrate (thermal expansion coefficient ($\alpha$): $6.5\times10^{-6}/°$ C., thermal conductivity: 180 W/(m·k)) and a W85—Cu15 substrate (thermal expansion coefficient ($\alpha$): $7.2\times10^{-6}/°$ C., thermal conductivity: 190 W/(m·k)). The W—Cu substrate can have a high thermal conductivity as well as securing good bonding strength with the glass sealing part, and can be sufficiently adapted for high-brightness and high-output LED's.

Although in the first to sixth embodiments the light emitting element is exemplified by the LED element, the light emitting element of the invention is not limited to it.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting device, comprising:
   mounting a light emitting element on a mounting portion;
   forming a phosphor layer near the mounting portion of the light emitting element;
   mixing a powder glass and a powder phosphor to produce a mixed powder such that the powder phosphor is dispersed in the powder glass;
   melting the mixed powder while reducing a volume of the mixed powder to produce a melt and then solidifying the melt to produce a phosphor dispersed glass; and
   slicing the phosphor dispersed glass into plates so as to form a glass sealing part, each of the plates having a thickness according to a thickness of the glass sealing part prior to bonding;
   bonding the glass sealing part to the mounting portion with the light emitting element mounted thereon to seal the light emitting element,
   wherein the bonding is conducted by hot pressing, and
   wherein the bonding is conducted such that a surface of the glass sealing part substantially parallel with a slicing direction of the slicing is bonded onto a substantially planar surface of the mounting portion.

2. The method according to claim 1, further comprising:
   forming the phosphor dispersed glass into a plate glass, wherein the bonding is conducted such that the plate glass is bonded to the mounting portion.

3. A method of making a light emitting device comprising:
   mounting a light emitting element on a mounting portion, the mounting portion including a wall portion formed at an outer side of the mounting portion;
   forming a phosphor layer near the mounting portion of the light emitting element such that the phosphor layer extends to an edge of a circuit pattern disposed outside an area covered by the light emitting element, the circuit pattern formed so as to supply power to the light emitting element;
   mixing a powder glass and a powder phosphor to produce a mixed powder such that the powder phosphor is dispersed in the powder glass;
   arranging the mixed powder inside of the wall portion of the mounting portion such that the wall portion acts as a mold; and
   melting the mixed powder within the wall portion while reducing a volume of the mixed powder to produce a melt in a decompression high-temperature atmosphere and then solidifying the melt to produce a phosphor dispersed glass on the mounting portion and to bond the phosphor dispersed glass to the mounting portion with the light emitting element mounted thereon to seal the light emitting element.

4. The method according to claim 1, further comprising:
   forming a hollow portion between a portion of the light emitting element and the mounting portion, which remains devoid of the glass sealing part.

5. The method according to claim 1, wherein said mounting portion comprises a circuit pattern formed to supply power to the light emitting element, and the circuit pattern is surrounded by a junction of the glass sealing part and the mounting portion.

6. The method according to claim 1, wherein the mounting portion comprises a roughened surface, and the glass sealing part is bonded to the mounting portion at a junction and comprises a surface roughened along the roughened surface at the junction.

7. The method according to claim 1, wherein said mounting portion comprises a circuit pattern formed to supply power to the light emitting element and a transparent material, and the circuit pattern is formed adjacent to the light emitting element.

8. The method according to claim 1, wherein said mounting portion comprises a transparent polycrystalline alumina.

9. The method according to claim 1, wherein said mounting portion comprises a circuit pattern formed to supply power to the light emitting element, and the circuit pattern comprises a top layer comprising Ag.

10. The method according to claim 1, wherein said mounting portion comprises a circuit pattern formed to supply power to the light emitting element, the light emitting element comprises an emission wavelength less than 550 nm, the circuit pattern comprises a top layer comprising Au, and the phosphor emits a light with a wavelength not less than 550 nm by being excited by the light emitted from the light emitting element.

11. The method according to claim 1, wherein said light emitting element emits a blue light, and the phosphor emits a yellow light by being excited by the blue light.

12. The method according to claim 1, wherein said light emitting element emits an ultraviolet light, and the phosphor comprises a blue phosphor to emit a blue light by being excited by the ultraviolet light, a green phosphor to emit a green light by being excited by the ultraviolet light, and a red phosphor to emit a red light by being excited by the ultraviolet light.

13. The method according to claim 1, wherein said phosphor dispersed glass comprises a ZnO—SiO$_2$R$_2$O based glass, where R comprises at least one of group I elements.

14. The method according to claim 1, wherein the phosphor layer formed near the mounting portion of the light emitting element is disposed on an entirety of an upper surface of the mounting portion of the light emitting element.

15. The method according to claim 3, wherein the phosphor layer formed near the mounting portion of the light emitting element is disposed on an entirety of an upper surface of the circuit pattern of the light emitting element.

16. The method according to claim 1, wherein the mixed powder includes no binder.

17. A method of making a light emitting device, comprising:
   mounting a light emitting element on a mounting portion;
   forming a phosphor layer near the mounting portion of the light emitting element;
   mixing a powder glass and a powder phosphor to produce a mixed powder such that the powder phosphor is dispersed in the powder glass;
   melting the mixed powder while reducing a volume of the mixed powder to produce a melt and then solidifying the melt to produce a phosphor dispersed glass; and
   bonding the phosphor dispersed glass to the mounting portion with the light emitting element mounted thereon to seal the light emitting element,
   wherein the bonding is conducted by hot pressing,
   wherein the phosphor dispersed glass is sliced prior to the bonding, and
   wherein the phosphor dispersed glass bonded to the mounting portion comprises a plurality of phosphor dispersed glass layers.

18. The method according to claim 17, wherein the plurality of phosphor dispersed glass layers comprises a first phosphor dispersed glass layer disposed between a second phosphor dispersed glass layer and the light emitting element, and
   wherein the second phosphor dispersed glass layer has a glass transition temperature higher than a glass transition temperature of the first phosphor dispersed glass layer.

19. The method according to claim 3, wherein the phosphor layer extends to an edge of the circuit pattern furthest from the light emitting element in a width direction of the circuit pattern.

20. The method according to claim 3, wherein a reflective pattern is formed on an inner surface of the wall portion.

* * * * *